United States Patent
Park et al.

(10) Patent No.: US 10,861,526 B2
(45) Date of Patent: Dec. 8, 2020

(54) SEMICONDUCTOR DEVICE AND SEMICONDUCTOR LOGIC DEVICE

(71) Applicant: KOREA ADVANCED INSTITUTE OF SCIENCE AND TECHNOLOGY, Daejeon (KR)

(72) Inventors: Byong Guk Park, Daejeon (KR); Seung Heon Baek, Daejeon (KR); Kyung Woong Park, Hanam (KR)

(73) Assignee: KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 0 days.

(21) Appl. No.: 16/285,948

(22) Filed: Feb. 26, 2019

(65) Prior Publication Data

US 2019/0189175 A1 Jun. 20, 2019

Related U.S. Application Data

(62) Division of application No. 15/723,278, filed on Oct. 3, 2017, now Pat. No. 10,360,963.

(30) Foreign Application Priority Data

Oct. 21, 2016 (KR) .......................... 10-2016-0137412

(51) Int. Cl.
*G11C 11/00* (2006.01)
*G11C 11/16* (2006.01)
(Continued)

(52) U.S. Cl.
CPC ........ *G11C 11/1675* (2013.01); *G11C 11/161* (2013.01); *G11C 11/1659* (2013.01); *G11C 11/1697* (2013.01); *G11C 11/18* (2013.01); *G11C 11/5607* (2013.01); *H01L 27/228* (2013.01); *H01L 43/06* (2013.01); *H01L 43/08* (2013.01); *H03K 19/18* (2013.01); *H03K 19/20* (2013.01)

(58) Field of Classification Search
CPC ..................................................... G11C 11/161
(Continued)

(56) References Cited

U.S. PATENT DOCUMENTS 5,699,293 A 12/1997 Tehrani et al.
5,986,925 A 11/1999 Naji et al.
(Continued)

FOREIGN PATENT DOCUMENTS

KR 10-2012-0025489 A 3/2012
KR 10-1266791 B1 5/2013
(Continued)

OTHER PUBLICATIONS

Office Action in Korean Patent Application No. 10-2019-0046436 dated Jul. 16, 2019.

*Primary Examiner* — Hoai V Ho
(74) *Attorney, Agent, or Firm* — Lando & Anastasi, LLP

(57) ABSTRACT

The present invention relates to a semiconductor device. The semiconductor device based on the spin orbit torque (SOT) effect, according to an example of the present invention, comprises the first electrode; and the first cell and the second cell connected to the first electrode, wherein the first and the second cells are arranged on the first electrode separately; the magnetic tunnel junction (MTJ) having a free magnetic layer and a pinned magnetic layer with a dielectric layer in between them; the magnetization direction of the free magnetic layer is changed when the current applied on the first electrode exceeds critical current value of each cell; and the critical current value of the first cell is different from that of the second cell.

3 Claims, 23 Drawing Sheets

(51) Int. Cl.
  *G11C 11/18* (2006.01)
  *G11C 11/56* (2006.01)
  *H01L 27/22* (2006.01)
  *H01L 43/08* (2006.01)
  *H03K 19/18* (2006.01)
  *H01L 43/06* (2006.01)
  *H03K 19/20* (2006.01)

(58) Field of Classification Search
  USPC .......................................................... 365/158
  See application file for complete search history.

(56) References Cited

U.S. PATENT DOCUMENTS

| | | | |
|---|---|---|---|
| 8,400,823 | B2 | 3/2013 | Xi et al. |
| 8,416,618 | B2 | 4/2013 | Gaudin et al. |
| 2005/0260772 | A1 | 11/2005 | Horng et al. |
| 2010/0302838 | A1 | 12/2010 | Wang et al. |
| 2011/0194341 | A1 | 8/2011 | Gaidis et al. |
| 2014/0169088 | A1 | 6/2014 | Buhrman et al. |
| 2015/0097159 | A1 | 4/2015 | Apalkov et al. |
| 2015/0236071 | A1 | 8/2015 | Lee et al. |
| 2016/0267961 | A1 | 9/2016 | Lee et al. |
| 2017/0365777 | A1* | 12/2017 | Mihajlovic .............. H01L 43/04 |
| 2018/0040807 | A1* | 2/2018 | Saito ...................... H01L 27/228 |
| 2018/0061482 | A1* | 3/2018 | Zhao ...................... G11C 11/161 |
| 2018/0174635 | A1 | 6/2018 | Yoda et al. |

FOREIGN PATENT DOCUMENTS

| | | |
|---|---|---|
| KR | 10-2015-0040238 A | 4/2015 |
| KR | 10-2015-0054804 A | 5/2015 |
| WO | 2010126854 A1 | 11/2010 |
| WO | 2014/025838 A1 | 2/2014 |

* cited by examiner

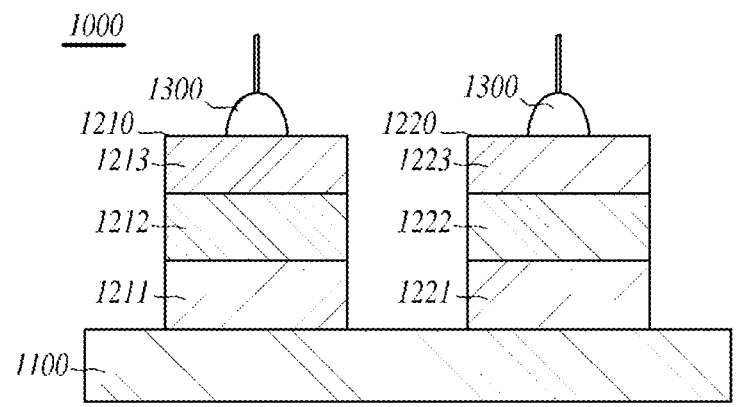
[Figure 1]
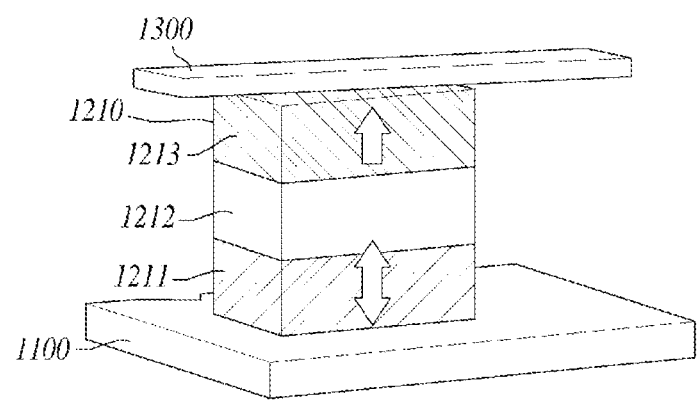
[Figure 2]

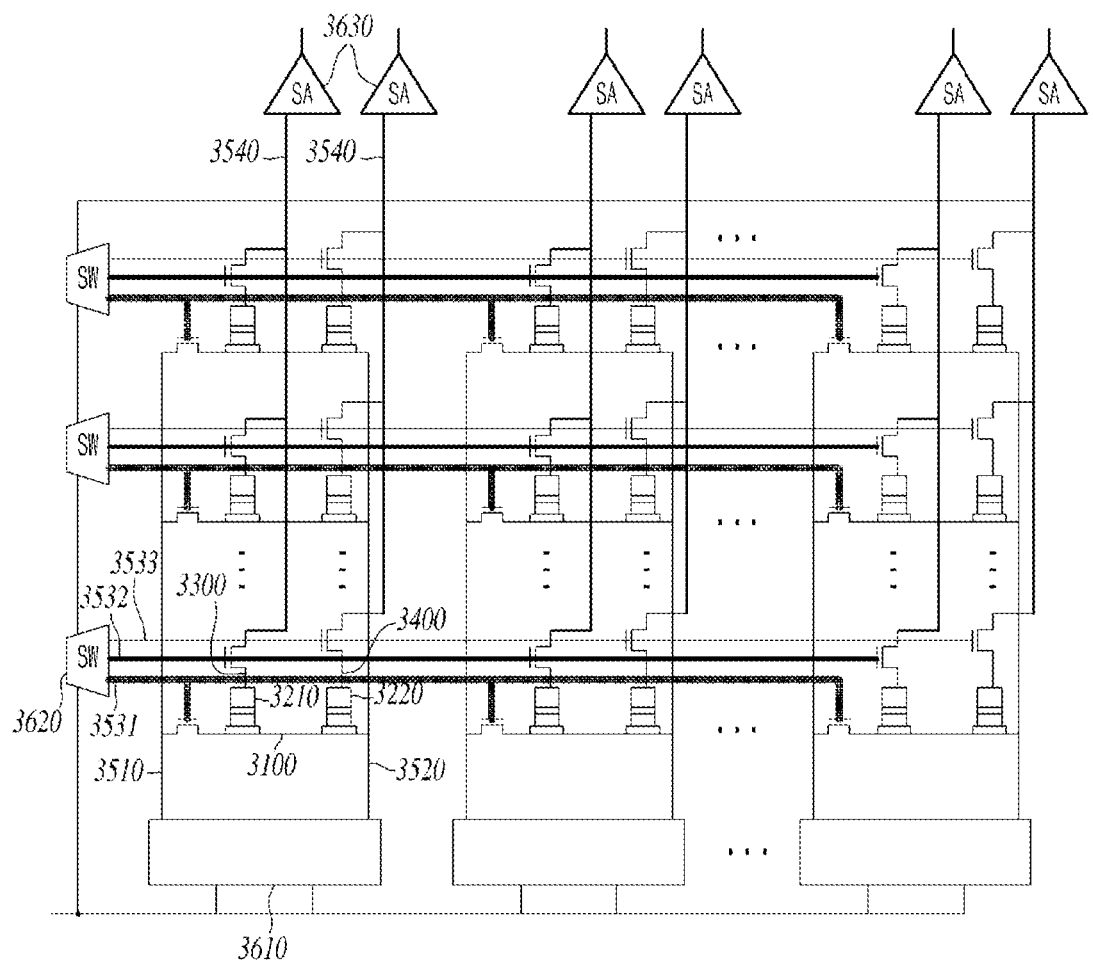
[Figure 3]
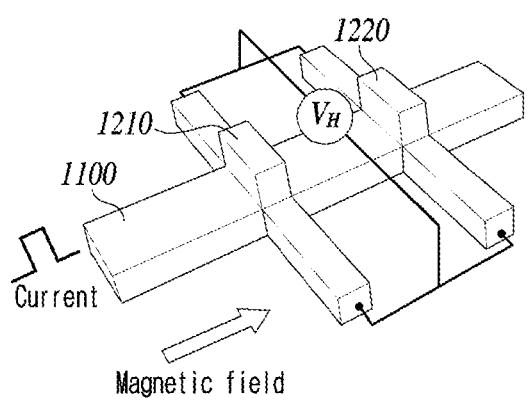
[Figure 4]

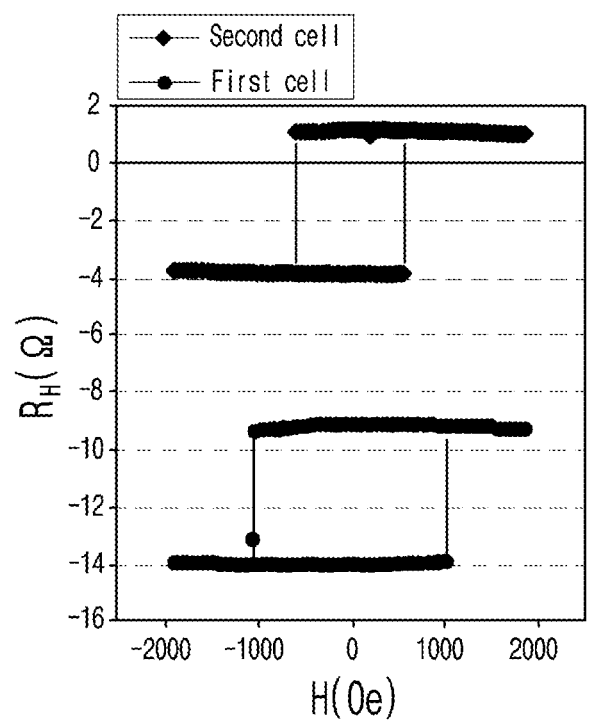
[Figure 5]
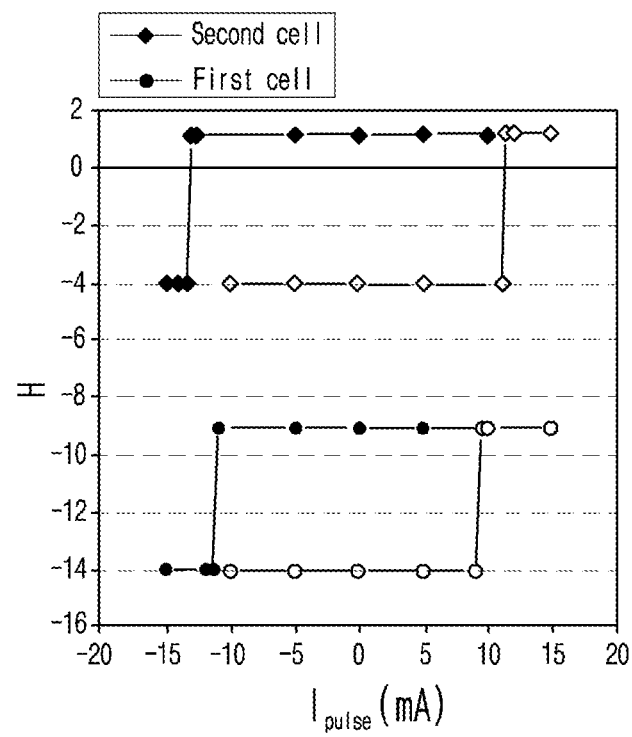
[Figure 6]

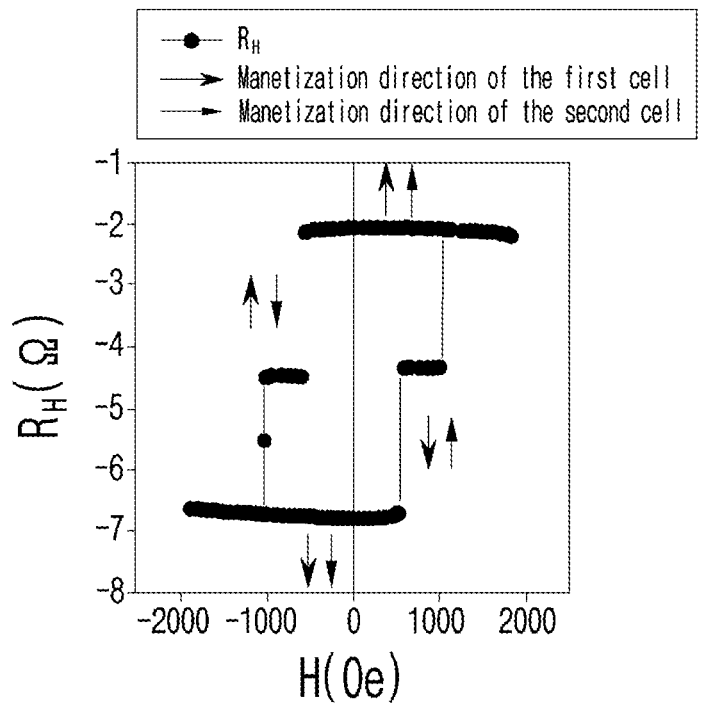
[Figure 7]
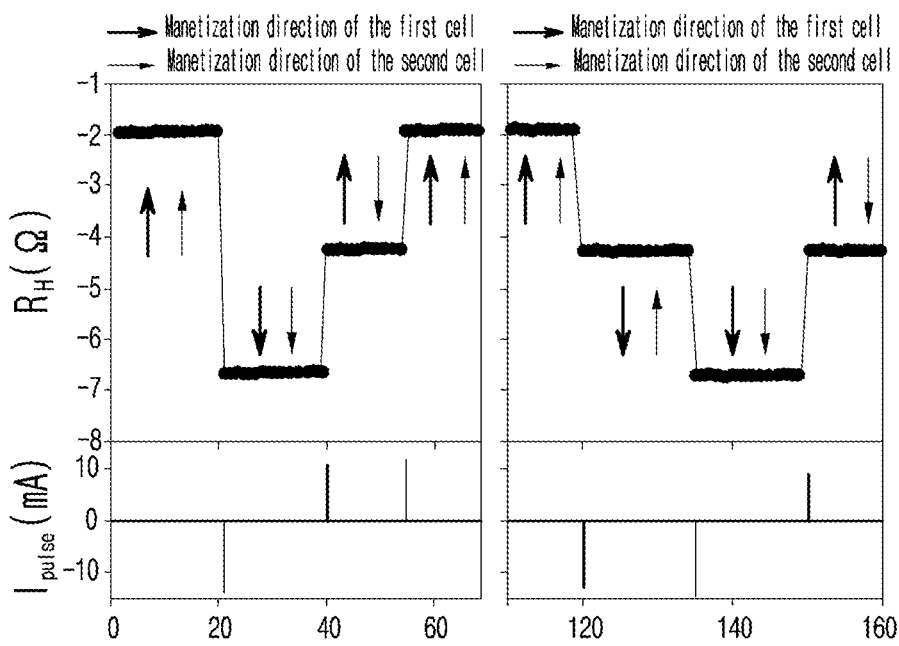
[Figure 8]

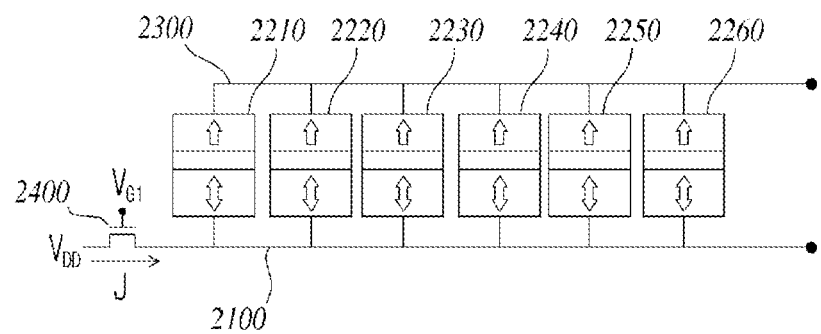
【Figure 9】
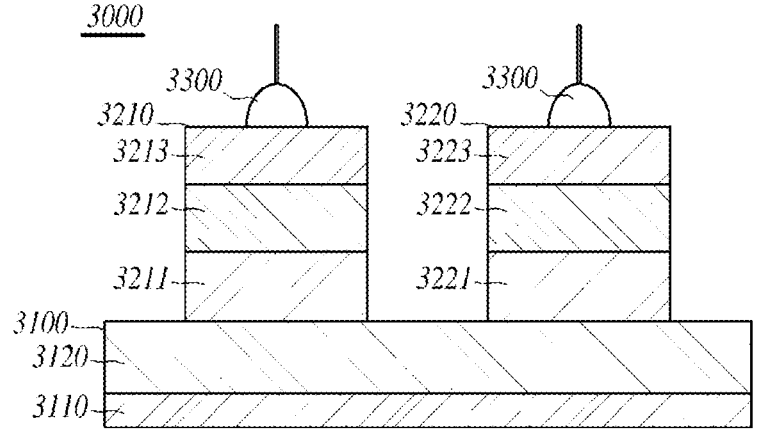
【Figure 10】

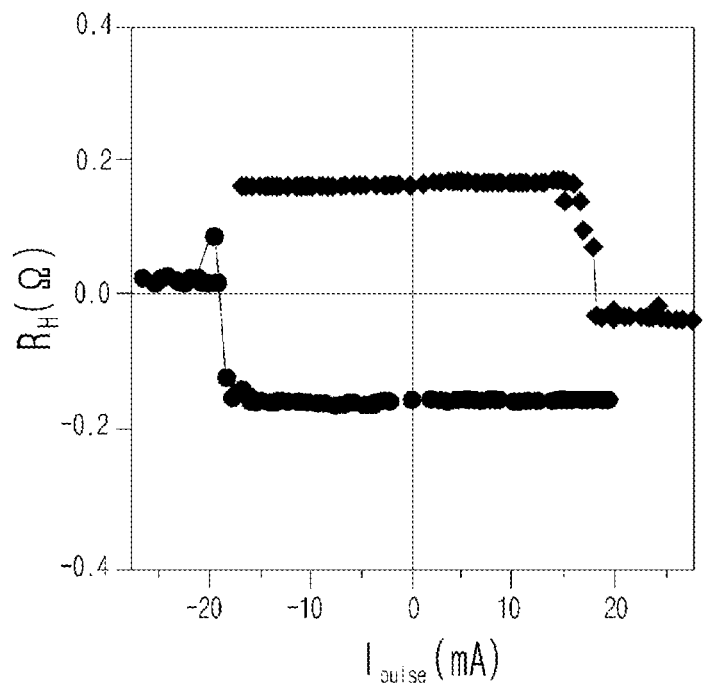
[Figure 11]
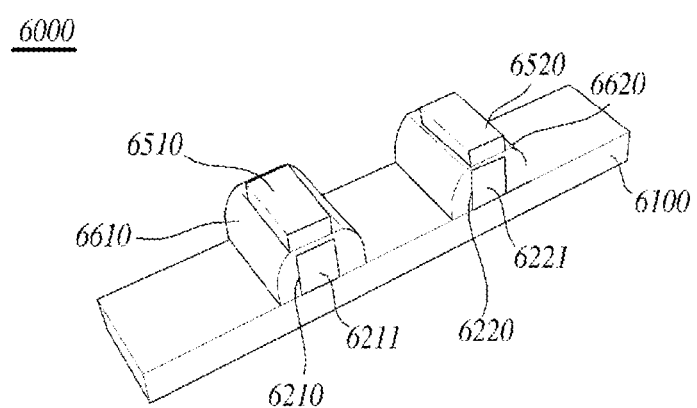
[Figure 12]

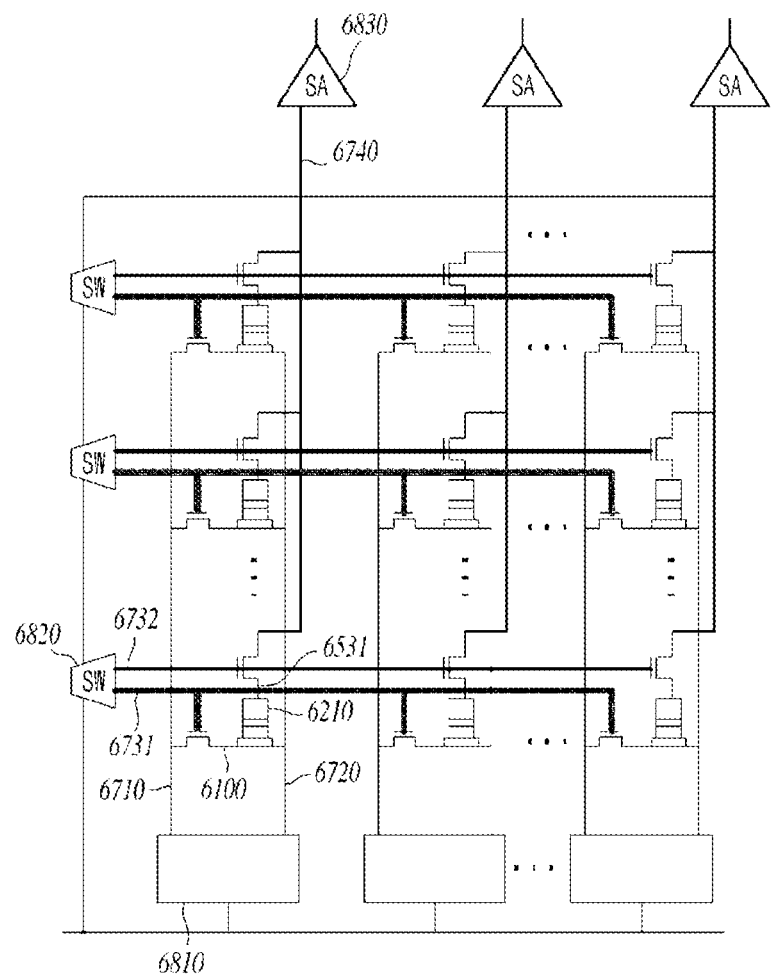
[Figure 13]
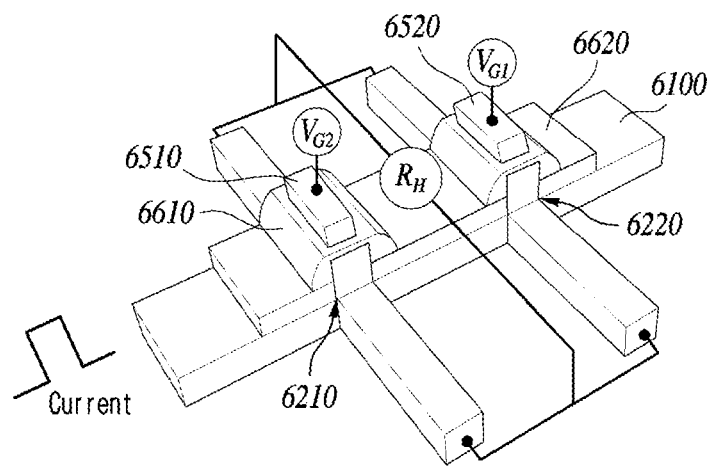
[Figure 14]

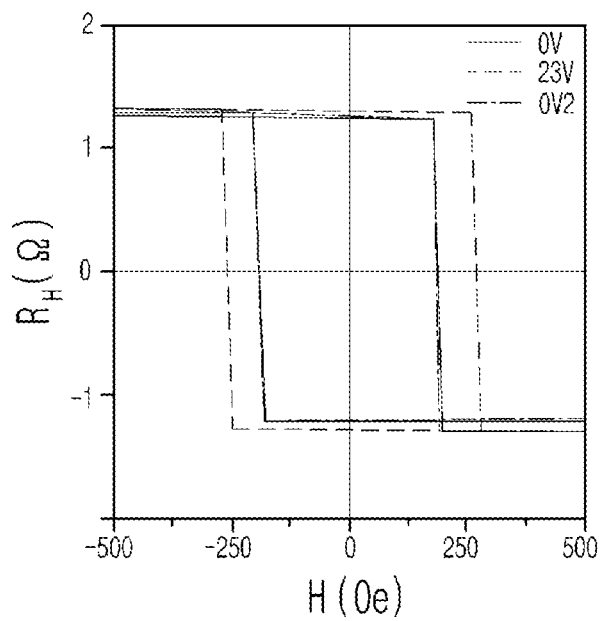
[Figure 15]
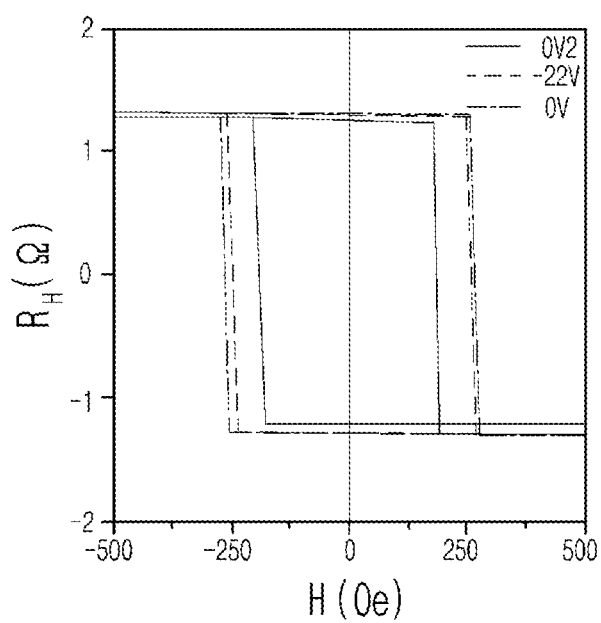
[Figure 16]

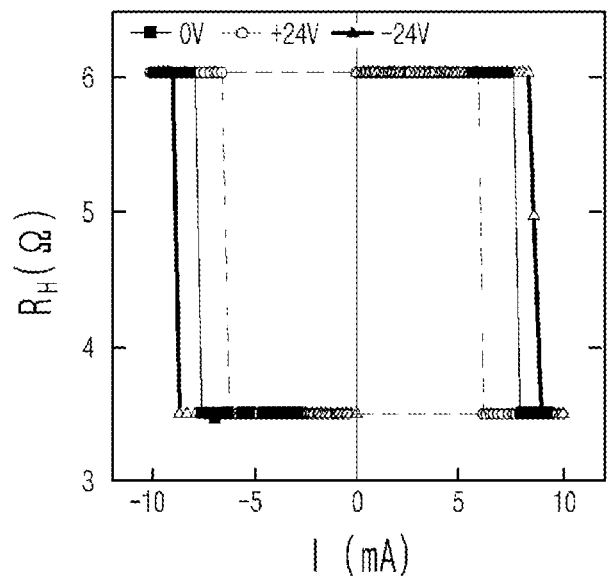
[Figure 17]
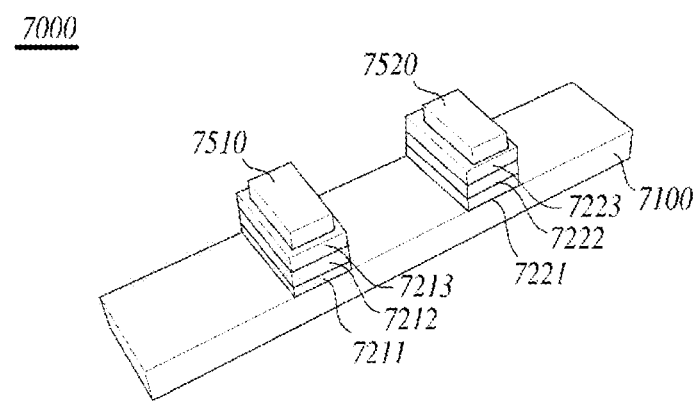
[Figure 18]

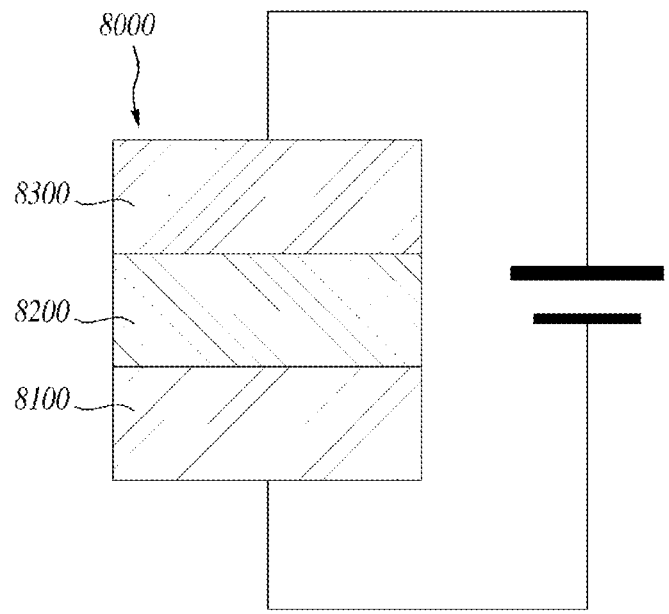
[Figure 19]
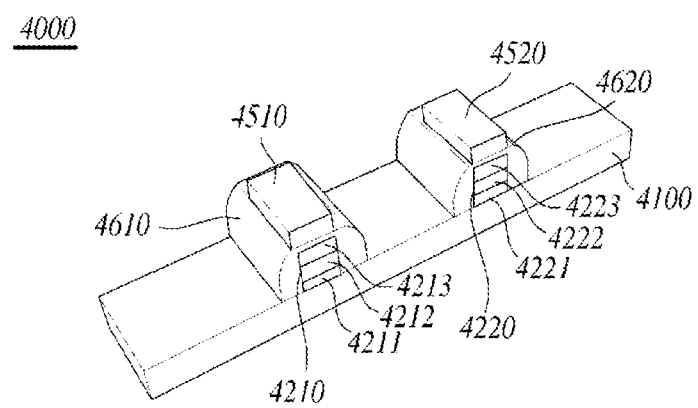
[Figure 20]

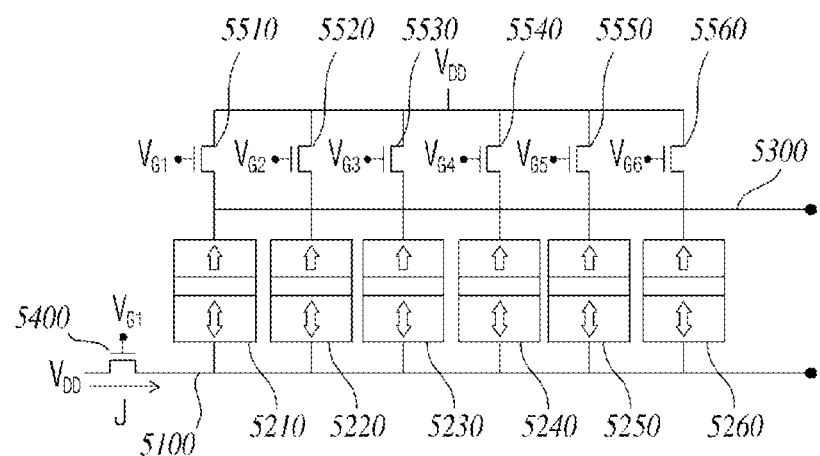
[Figure 21]
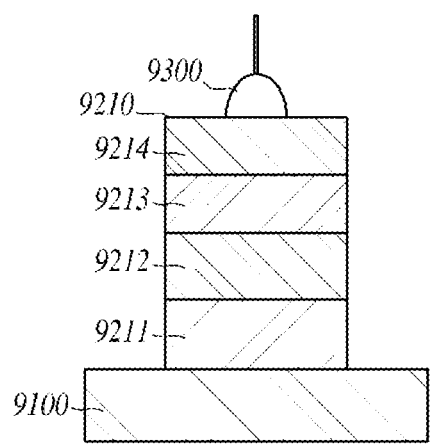
[Figure 22]

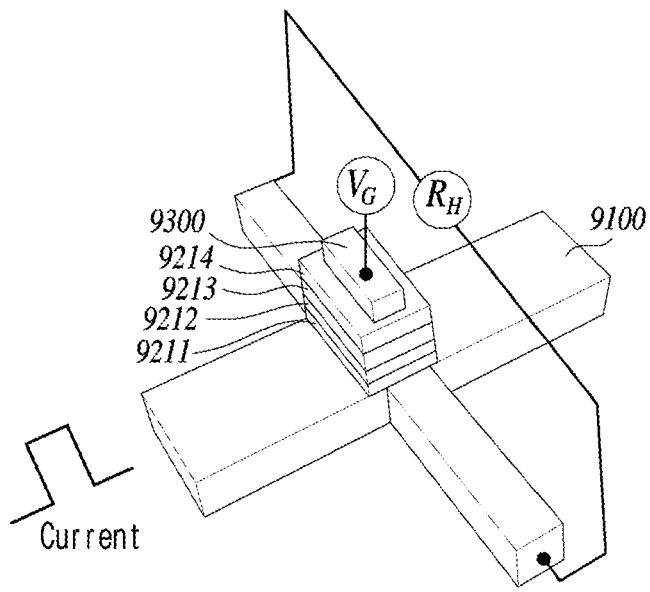
[Figure 23]
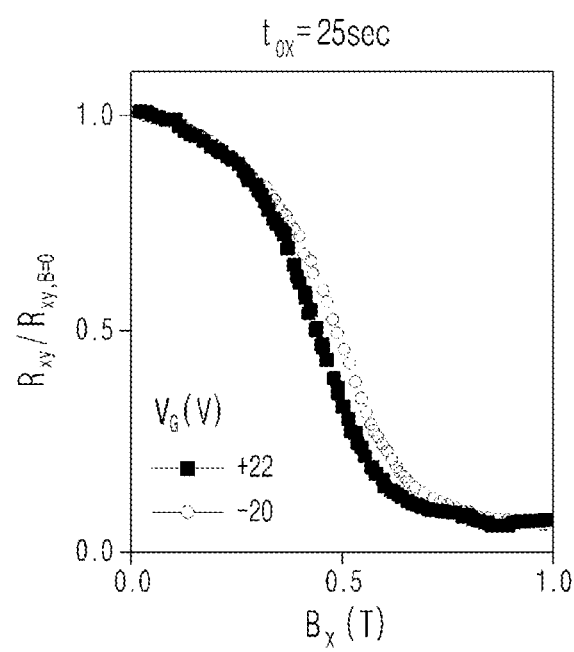
[Figure 24]

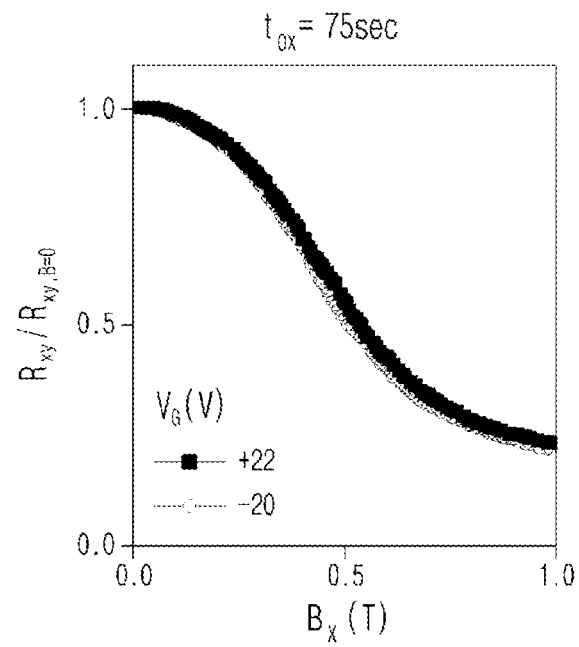
[Figure 25]
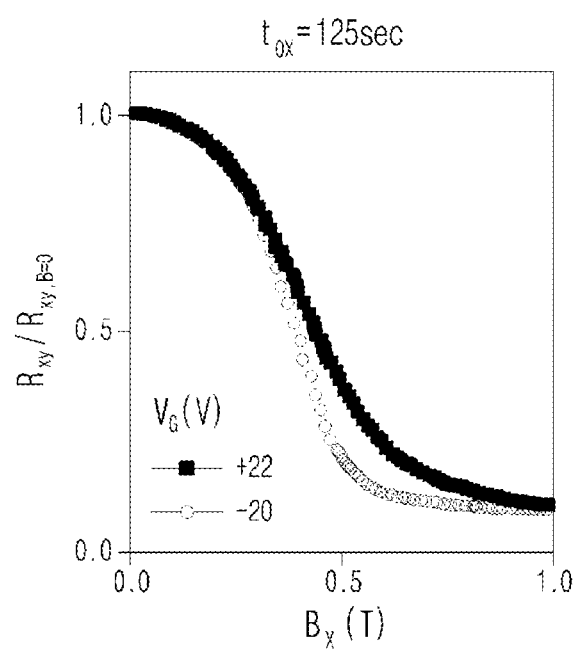
[Figure 26]

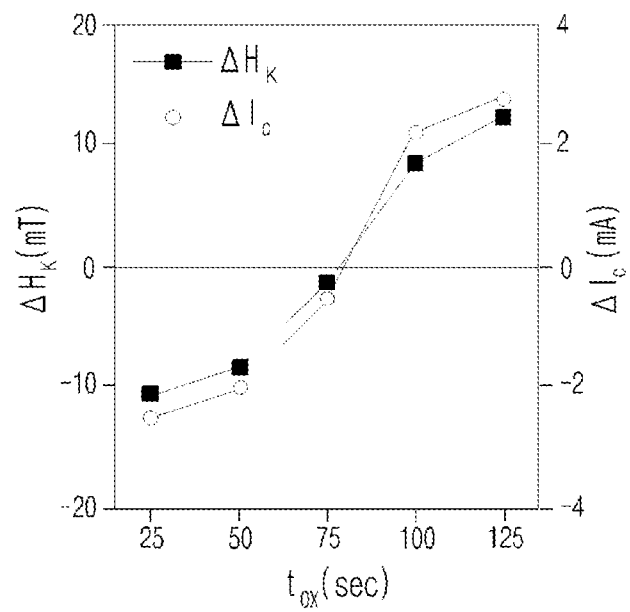
[Figure 27]
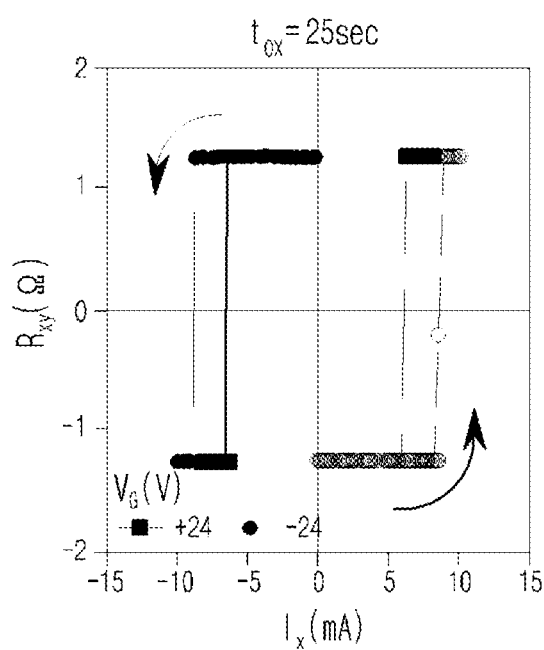
[Figure 28]

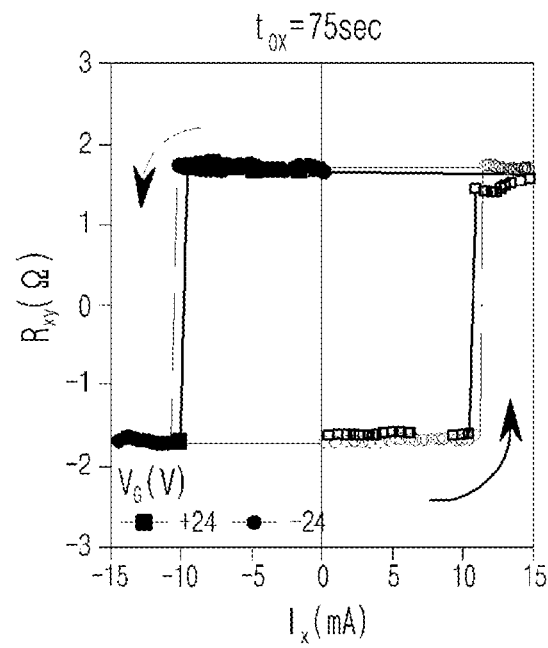
[Figure 29]
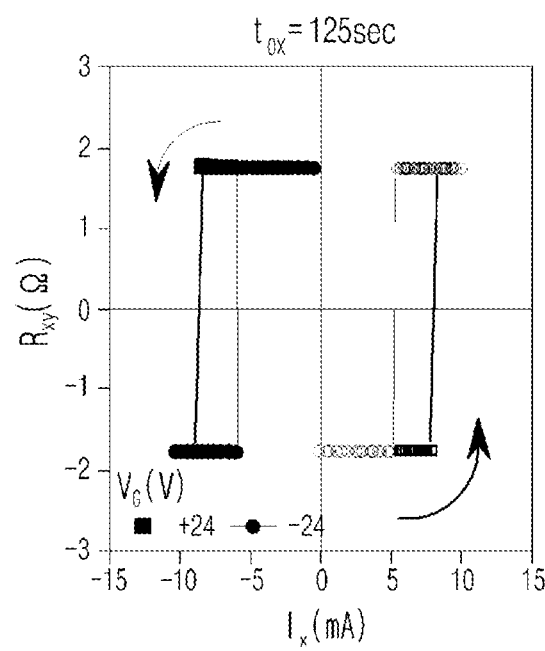
[Figure 30]

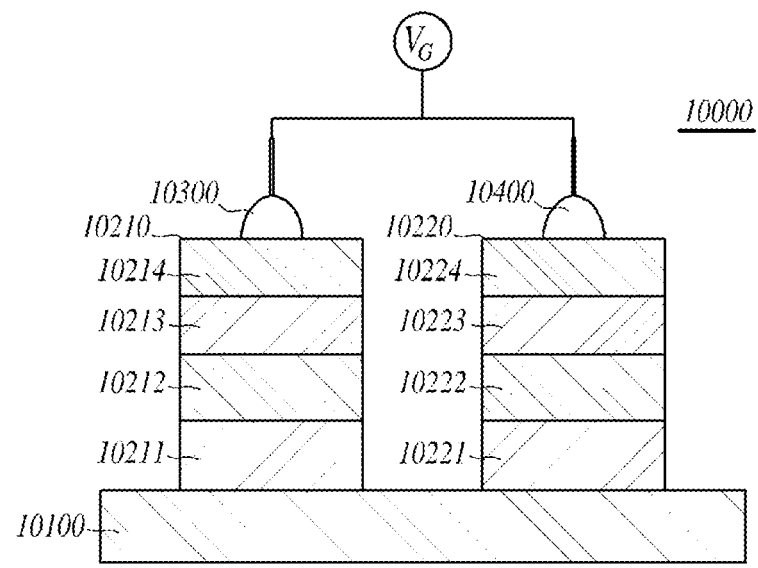
[Figure 31]
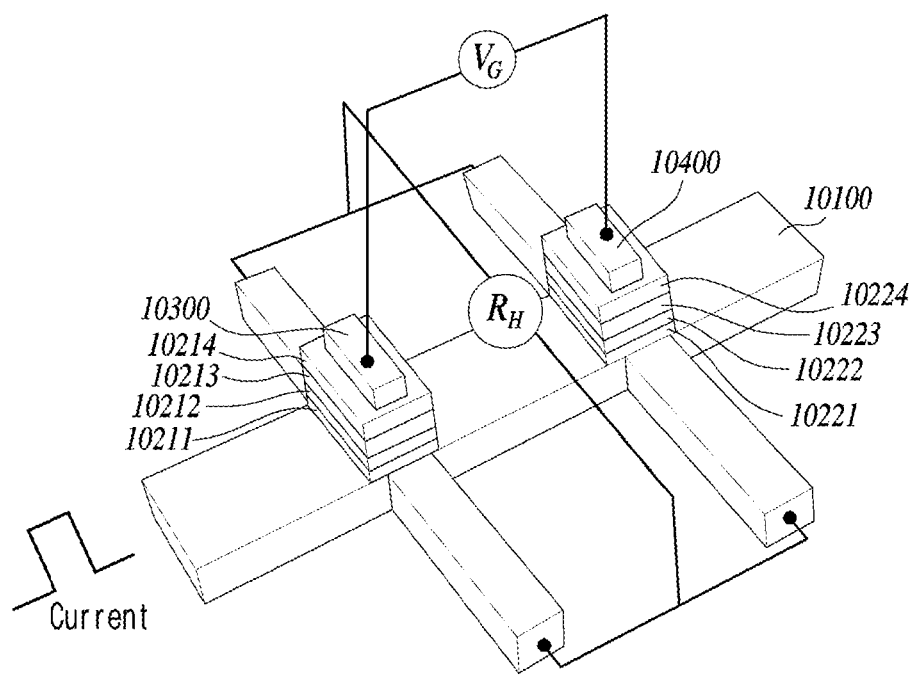
[Figure 32]

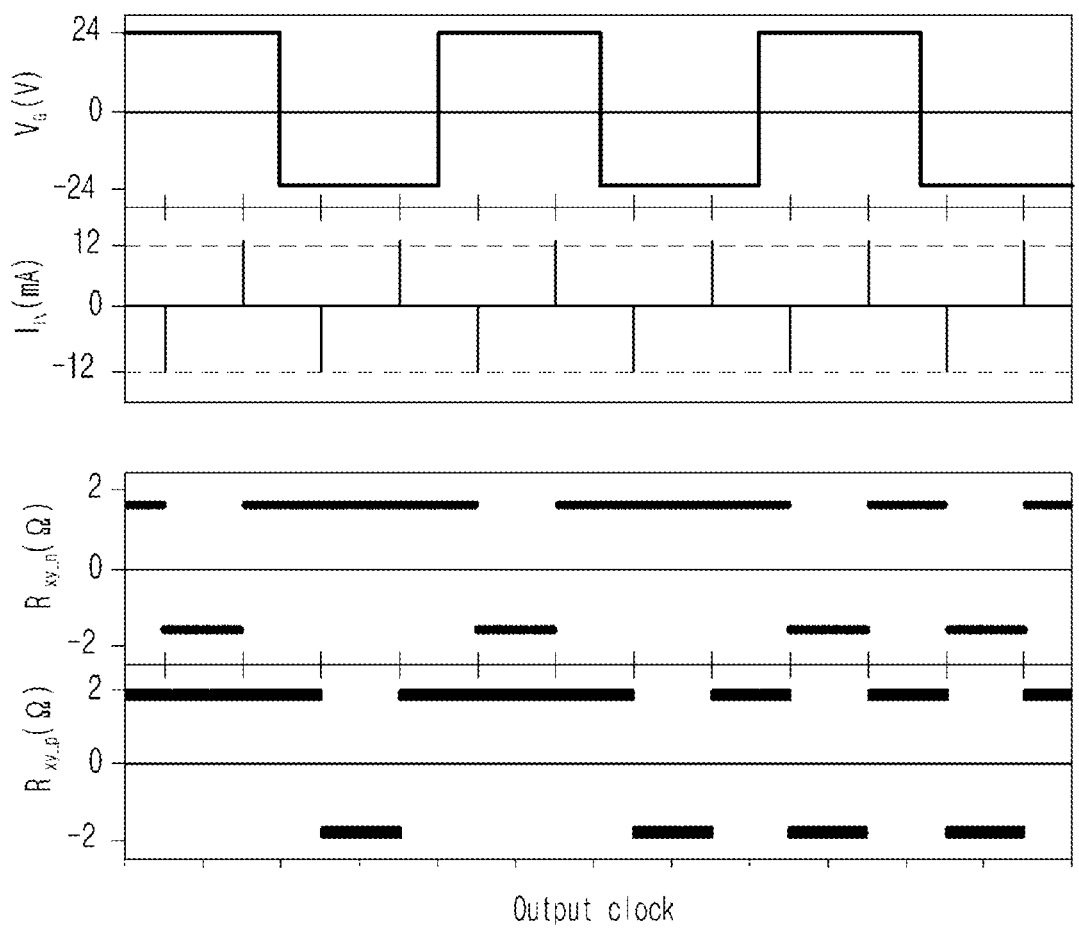
[Figure 33]
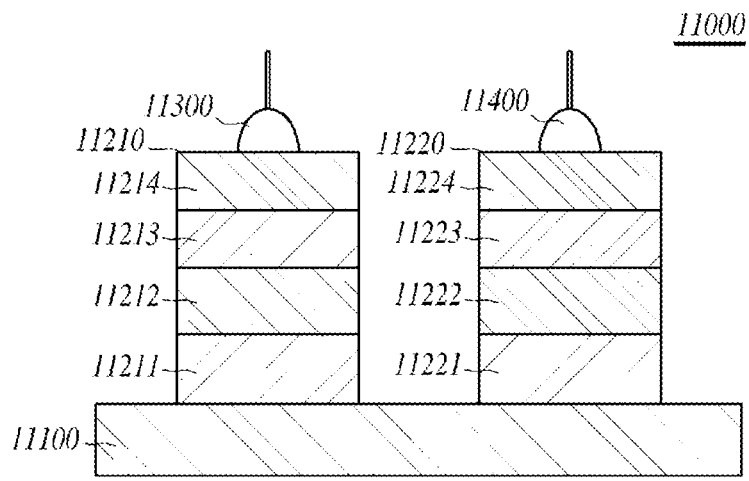
[Figure 34]

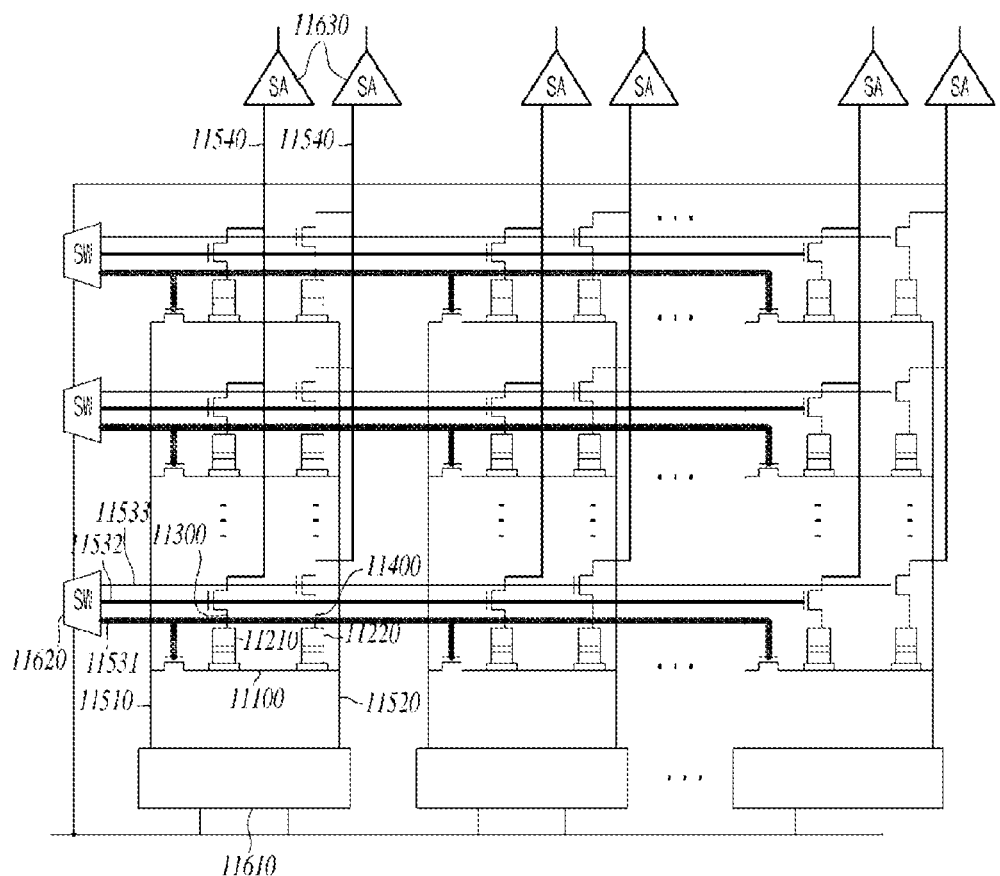
[Figure 35]
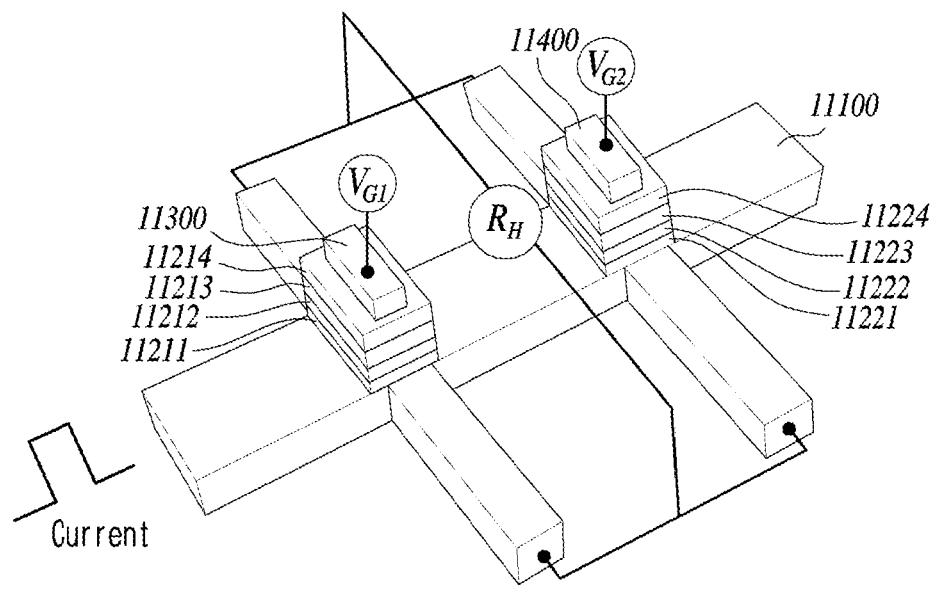
[Figure 36]

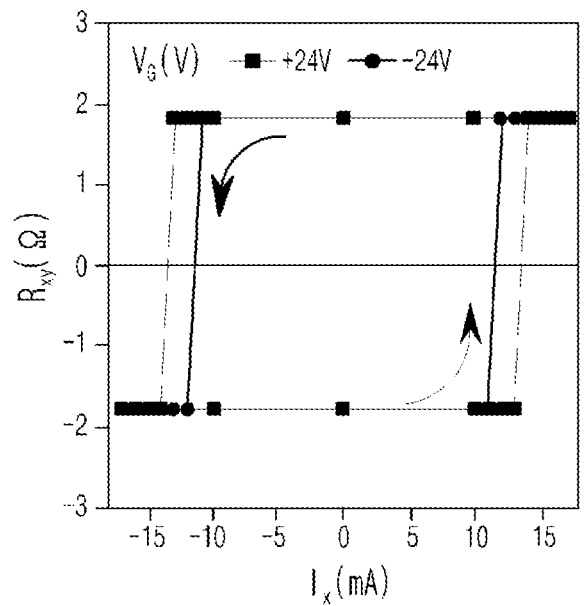
[Figure 37]
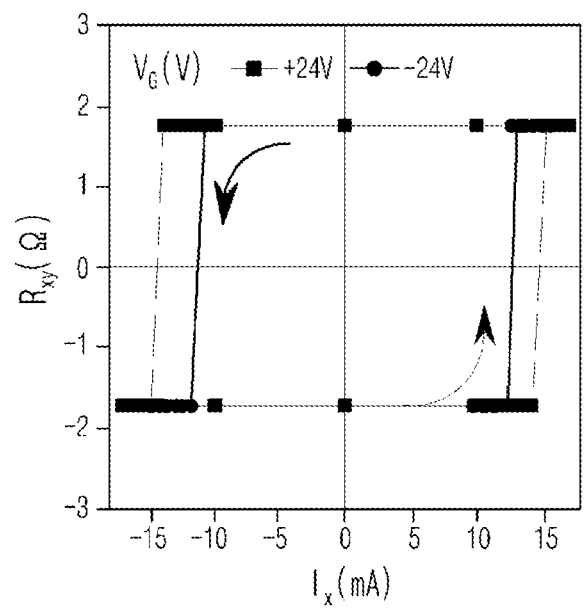
[Figure 38]

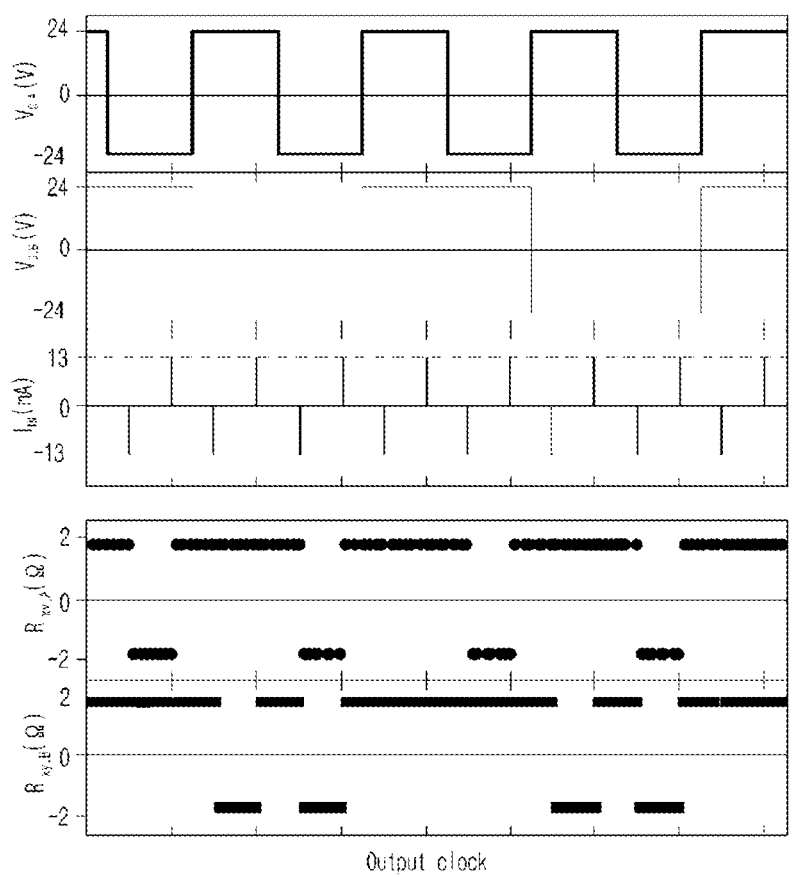
[Figure 39]
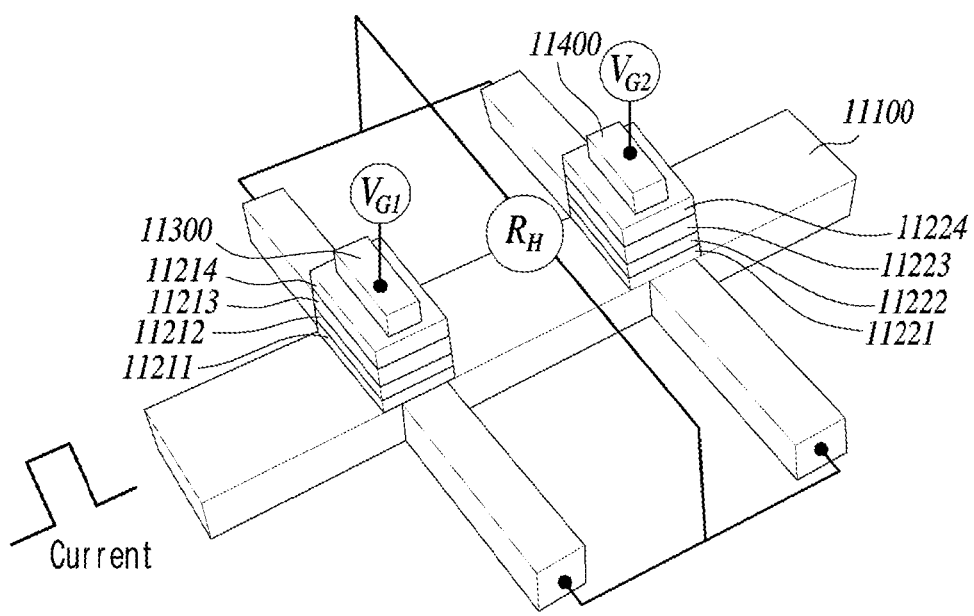
[Figure 40]

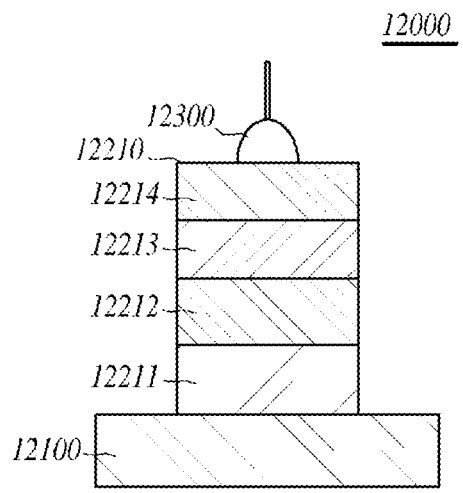
[Figure 41]
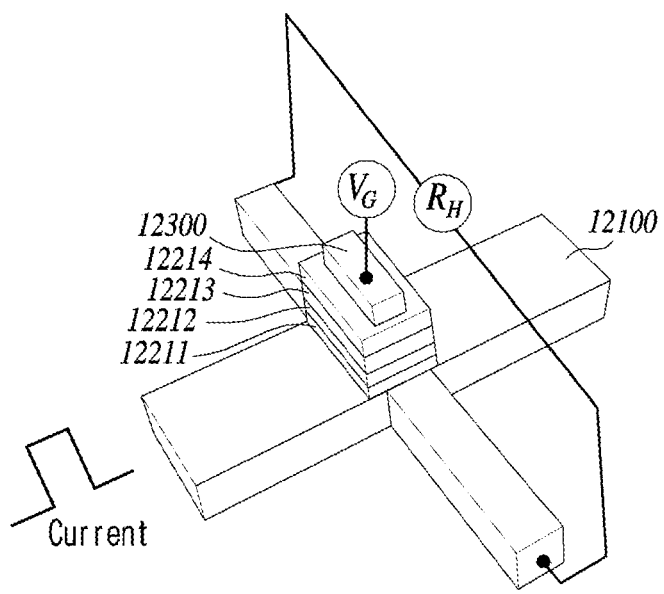
[Figure 42]

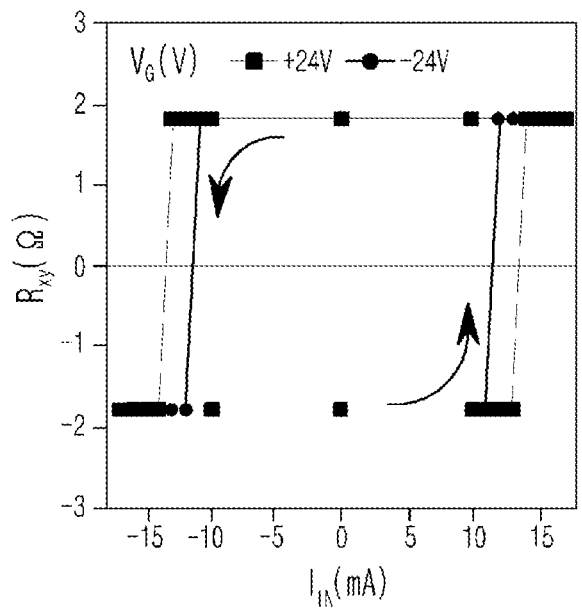
【Figure 43】
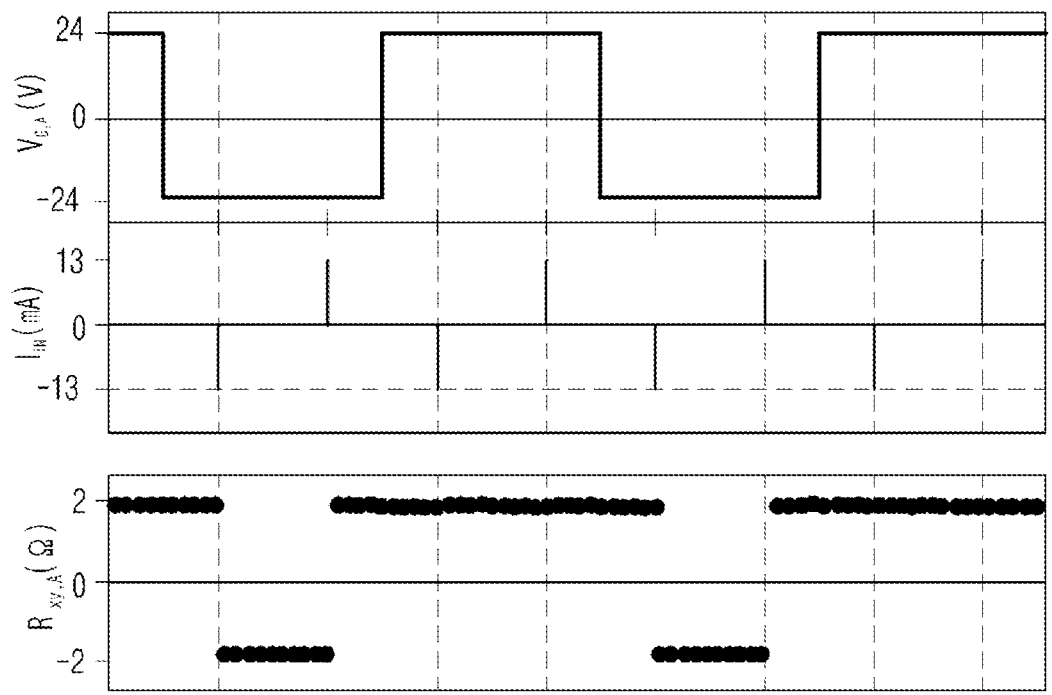
【Figure 44】

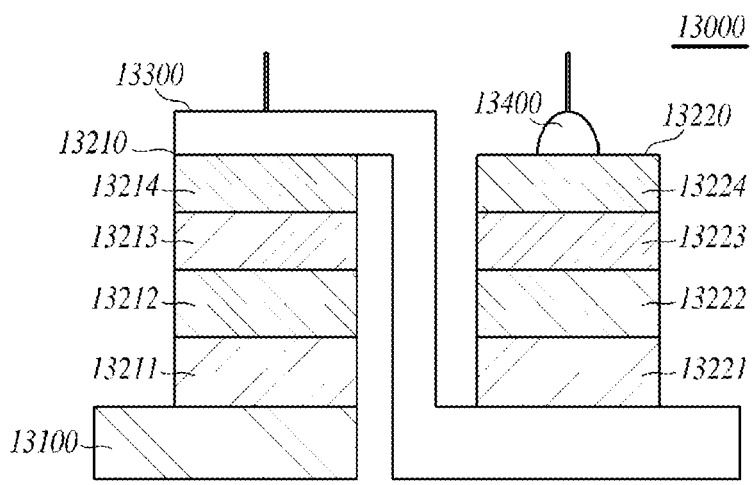
[Figure 45]
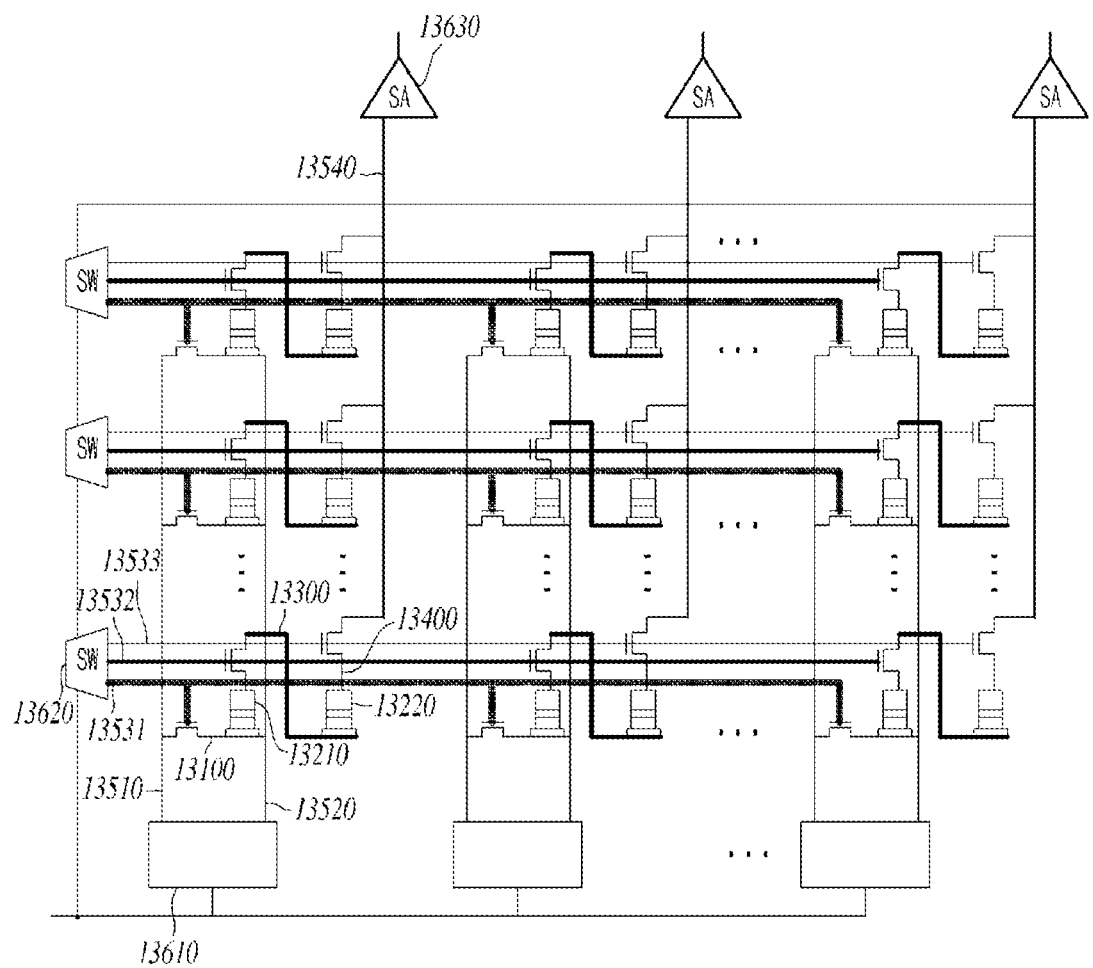
[Figure 46]

SEMICONDUCTOR DEVICE AND SEMICONDUCTOR LOGIC DEVICE

CROSS-REFERENCE TO RELATED APPLICATIONS

This application claims priority under 35 U.S.C. § 121 and is a divisional of U.S. patent application Ser. No. 15/723,278 filed on Oct. 3, 2017, which claims priority under 35 U.S.C. 119(b) to Korean Patent Application No. KR10-2016-0137412, filed Oct. 21, 2016. Each of these applications is herein incorporated by reference in its entirety for all purposes.

BACKGROUND OF THE INVENTION

1. Field of the Invention

The present invention relates to a semiconductor device and a semiconductor logic device.

2. Description of the Related Art

Recent targets of study on the semiconductor device are magnetic memory device and phase change device. Among them, the magnetic memory device is characterized by fast speed and low operating voltage in addition to being non-volatile, so it is ideal for a memory device. In general, such magnetic memory device, as described in U.S. Pat. No. 5,699,293, is composed of a unit cell comprising one magnetoresistance sensor and one transistor.

The basic structure of the magnetic memory device includes the magnetic tunneling junction having two ferromagnetic materials with the dielectric layer in between (the first magnetic electrode/insulator/the second magnetic electrode). It provides information through the magnetoresistance of the device that would be changed according to the relative magnetization direction of the two different magnetic materials. The magnetization direction of those two magnetic layers can be regulated by spin-polarized current, which is called 'spin transfer torque' wherein angular momentum possessed by electrons is delivered to magnetic moment to cause torque.

To control the magnetization direction by using spin transfer torque, spin-polarized current needs to pass through inside the magnetic material. However, as described in the following: a new technique, called spin orbit torque technique, has been proposed to induce magnetization switching of a magnetic material by in-plane current supply by placing a heavy metal inducing spin current close to the magnetic material: U.S. Pat. No. 8,416,618, Writable magnetic memory element, US 2014-0169088, Spin Hall magnetic apparatus, method and application, KR1266791, Magnetic memory device using in-plane current and electric field.

SUMMARY OF THE INVENTION

It is an object of the present invention to provide a semiconductor device characterized by fast speed of saving, recognizing, and transferring information and low energy consumption.

This device of the invention favors high integration, indicating the performance of the semiconductor device is improved but the production cost thereof is reduced.

The semiconductor device of the present invention can be applied to various fields by changing the magnetization characteristics of each cell.

In addition, logic gates such as AND, OR, NAND, and NOR can be realized.

The semiconductor device (1000) based on the spin orbit torque (SOT) effect according to an example of the present invention comprises the first electrode; and the first cell and the second cell connected to the first electrode, wherein the first and the second cells are arranged on the first electrode separately and include the magnetic tunnel junction (MTJ) having a free magnetic layer and a pinned magnetic layer with a dielectric layer in between them; the magnetization direction of the free magnetic layer is changed when the current applied on the surface of the first electrode exceeds critical current value of each cell; and the critical current value of the first cell is different from that of the second cell.

On the first electrode, the input circuit to which current is applied between the first position and the second position disposed between the first cell and the second cell, the first output circuit in which current flows from the first position of the first electrode through the first cell, and the second output circuit in which current flows from the first position of the first electrode through the second cell are included. Information is stored in the first cell or the second cell by the current applied along the input circuit, and the information can be read by measuring the electrical characteristics of the first output circuit and the second output circuit.

In the method to control the semiconductor device based on the spin orbit torque (SOT) effect comprising the input circuit to which current is applied between the first position and the second position disposed between the first cell and the second cell, the first output circuit in which current flows from the first position of the first electrode through the first cell, and the second output circuit in which current flows from the first position of the first electrode through the second cell according to an example of the present invention, the input circuit is operated to apply current higher than critical current enough to change the magnetization direction of the free magnetic layer of the first cell on the first electrode to store information in the first cell, and then the input circuit is operated to input current higher than critical current enough to change the magnetization direction of the free magnetic layer of the second cell on the first electrode to store information in the second cell.

The information stored in the first cell and the second cell can be read by applying current on the first output circuit and the second output circuit.

The semiconductor device based on the spin orbit torque (SOT) effect according to another example of the present invention comprises the first electrode; the cell including a magnetic tunneling junction (MTJ) disposed on the first electrode and having a free magnetic layer and a pinned magnetic layer interposed between a dielectric layer; and the voltage circuit that is electrically connected to the cell and applies voltage between the free magnetic layer and the pinned magnetic layer; wherein the voltage applied by the voltage circuit controls the critical current value of the cell.

On the first electrode, the input circuit to which current is applied between the first position and the second position disposed across the cell; and the voltage circuit for applying voltage between the free magnetic layer and the pinned magnetic layer can be additionally included.

In the method to control the semiconductor device based on the spin orbit torque (SOT) effect comprising the input circuit to which current is applied to the first electrode including the first position and the second position, the cell including the magnetic tunneling junction (MTJ) disposed between the first and second positions in which the magnetization direction of the free magnetic layer is changed by the write current applied by the write current circuit, and the write voltage circuit for applying voltage between the free magnetic layer and the pinned magnetic layer disposed between the free magnetic layer and the dielectric layer, the step of operating the write voltage circuit to apply voltage between the pinned magnetic layer and the free magnetic layer to change the critical current value of the cell; and the step of storing information in the cell by operating the write current circuit to apply current to the first electrode and thus to change the magnetization direction of the free magnetic layer are included.

The semiconductor device based on the spin orbit torque (SOT) effect according to another example of the present invention comprises the first electrode; the cell including a magnetic tunneling junction (MTJ) in which a free magnetic layer and a pinned magnetic layer are disposed with a structure wherein a dielectric layer and a control layer are neighbored; and the control voltage gate for applying voltage between the free magnetic layer and the pinned magnetic layer; wherein the control layer controls the electric level of the interface of the free magnetic layer and the dielectric layer by the voltage applied to the control voltage gate and as the control layer controls the electric level, the critical current value of the cell is controlled.

The logic semiconductor device based on the spin orbit torque (SOT) effect according to another example of the present invention comprises the first input terminal for applying current to the first electrode including the first position and the second position; the first cell and the second cell containing a magnetic tunneling junction (MTJ) disposed between the first position and the second position of the first electrode and having a free magnetic layer and a pinned magnetic layer arranged with the neighbored structure of the dielectric layer and the control layer in between them; the output terminal for outputting an output value obtained by adding a value generated by the current passing through the first input terminal and the first cell and a value generated by the current passing through the first input terminal and the second cell; and the second input terminal for applying voltage between the free magnetic layer and the pinned magnetic layer of the first cell and the second cell, wherein the output value resulted from the output terminal is divided into digital 0 or digital 1 according to the level of the input value received by the first input terminal and the second input terminal.

The logic semiconductor device based on the spin orbit torque (SOT) effect according to another example of the present invention comprises the input circuit for applying current to the first electrode comprising the first position and the second position; the first cell and the second cell containing a magnetic tunneling junction (MTJ) disposed between the first position and the second position of the first electrode and having a free magnetic layer and a pinned magnetic layer arranged with the neighbored structure of the dielectric layer and the control layer in between them; the first input terminal for applying voltage between the free magnetic layer and the pinned magnetic layer of the first cell; the second input terminal for applying voltage between the free magnetic layer and the pinned magnetic layer of the second cell; and the output terminal for outputting an output value obtained by adding a value generated by the current passing through the first input terminal and the first cell and a value generated by the current passing through the first input terminal and the second cell. At this time, when the input circuit applies current to the first electrode, the output value output from the output terminal is divided into digital 0 or digital 1 according to the level of the input value input to the first input terminal and the second input terminal.

The logic semiconductor device based on the spin orbit torque (SOT) effect according to another example of the present invention comprises the first input terminal for applying current to the first electrode including the first position and the second position; the cell containing a magnetic tunneling junction (MTJ) disposed between the first position and the second position of the first electrode and having a free magnetic layer arranged in the first electrode, a dielectric layer arranged in the free magnetic layer, and a pinned magnetic layer arranged in the dielectric layer; the second input terminal for applying voltage between the free magnetic layer and the pinned magnetic layer of the cell; and the output terminal for outputting a value generated by current passing through the first electrode and the cell, wherein the output value resulted from the output terminal is divided into digital 0 or digital 1 according to the level of the input value received by the first input terminal and the second input terminal.

The logic semiconductor device based on the spin orbit torque (SOT) effect according to another example of the present invention comprises the first input terminal for applying current to the first electrode; the first cell containing a magnetic tunneling junction (MTJ) disposed between the first position and the second position of the first electrode and having a free magnetic layer and a pinned magnetic layer arranged with the neighbored structure of the dielectric layer and the control layer in between them; the first voltage gate for applying voltage between the free magnetic layer and the pinned magnetic layer of the first cell; the second cell containing a magnetic tunneling junction (MTJ) disposed on the second electrode receiving current from the first cell and having a free magnetic layer and a pinned magnetic layer arranged with the neighbored structure of the dielectric layer and the control layer in between them; the second voltage gate for applying voltage between the free magnetic layer and the pinned magnetic layer of the second cell; the output terminal for outputting an output value output through the second cell; the input circuit in which the current applied from the first input terminal flows along the first electrode, the first cell, and the second electrode; and the output circuit in which the current applied from the first input terminal flows along the first electrode, the first cell, and the second cell.

Advantageous Effect

The semiconductor device according to an example of the present invention is characterized by high speed of saving, recognizing, and transferring information, in addition to low energy consumption.

The semiconductor device of the present invention facilitates high integration, resulting in the effect of improving performance of the semiconductor device and reducing production costs.

The semiconductor device can be applied to various fields by changing the magnetization characteristics of each cell of the final product.

The semiconductor device of the present invention can also realize logic gates such as AND, OR, NAND, and NOR.

BRIEF DESCRIPTION OF THE DRAWINGS

The application of the preferred embodiments of the present invention is best understood with reference to the accompanying drawings, wherein:

FIG. 1 is a diagram illustrating the semiconductor device based on the spin orbit torque (SOT) effect according to an example of the present invention.

FIG. 2 is a diagram illustrating the behavior of the magnetization direction of the free magnetic layer and the pinned magnetic layer.

FIG. 3 is a diagram illustrating the semiconductor device based on the spin orbit torque (SOT) effect comprising the input circuit, the first output circuit, and the second output circuit.

FIG. 4 is a diagram illustrating the measurement of AHE (Anomalous Hall Effect) voltage in the semiconductor device based on the spin orbit torque (SOT) effect according to an example of the present invention.

FIG. 5 is a graph illustrating the state changes of the first cell and the second cell according to the magnetic field.

FIG. 6 is a graph illustrating the state changes of the first cell and the second cell according to current.

FIG. 7 is a graph illustrating the changes of the magnetization direction of the total cells according to the magnetic field.

FIG. 8 is a set of graphs illustrating the changes of the magnetization direction of the total cells according to current.

FIG. 9 is a diagram illustrating the semiconductor device based on the spin orbit torque (SOT) effect according to another example of the present invention.

FIG. 10 is a diagram illustrating the semiconductor device based on the spin orbit torque (SOT) effect according to another example of the present invention.

FIG. 11 is a graph illustrating the changes of the magnetization direction of the free magnetic layer of the semiconductor device of FIG. 10 by the current applied to the first electrode in the magnetic field free environment.

FIG. 12 is a diagram illustrating the semiconductor device based on the spin orbit torque (SOT) effect according to another example of the present invention.

FIG. 13 is a diagram illustrating the semiconductor device based on the spin orbit torque (SOT) effect comprising the input circuit and the voltage circuit.

FIG. 14 is a schematic diagram illustrating the experiment to measure anomalous hall resistance of the semiconductor device of FIG. 12.

FIG. 15~FIG. 17 are graphs illustrating the anomalous hall resistance measured according to FIG. 14.

FIG. 18 is a diagram illustrating the semiconductor device based on the spin orbit torque (SOT) effect according to another example of the present invention.

FIG. 19 is a schematic diagram illustrating the experimental cell.

FIG. 20 is a diagram illustrating the semiconductor device based on the spin orbit torque (SOT) effect according to another example of the present invention.

FIG. 21 is a diagram illustrating the semiconductor device based on the spin orbit torque (SOT) effect according to another example of the present invention.

FIG. 22 is a diagram illustrating the semiconductor device based on the spin orbit torque (SOT) effect according to another example of the present invention.

FIG. 23 is a diagram illustrating the measurement of AHE (Anomalous Hall Effect) voltage in the semiconductor device based on the spin orbit torque (SOT) effect according to another example of the present invention.

FIG. 24~FIG. 26 are graphs illustrating the changes of anomalous hall effect against the magnetic field according to the oxidation time of the control layer in the semiconductor device of FIG. 23.

FIG. 27 is a graph illustrating the changes in the perpendicular anisotropy field variation ($\Delta H_k$) and the critical current variation ($\Delta I_c$) according to the oxidation time of the control layer of the semiconductor device of FIG. 23.

FIG. 28~FIG. 30 are graphs illustrating the anomalous hall effect and the magnetization switching according to the oxidation time of the control layer of the semiconductor device of FIG. 23.

FIG. 31 is a diagram illustrating the semiconductor device based on the spin orbit torque (SOT) effect according to another example of the present invention.

FIG. 32 is a diagram illustrating the measurement of AHE (Anomalous Hall Effect) voltage in the semiconductor device based on the spin orbit torque (SOT) effect according to another example of the present invention.

FIG. 33 is a set of graphs illustrating the input values of the first input terminal and the second input terminal of the semiconductor device of FIG. 32 and the resultant output values thereby measured at the output terminals of the first cell and the second cell.

FIG. 34 is a diagram illustrating the semiconductor device based on the spin orbit torque (SOT) effect according to another example of the present invention.

FIG. 35 is a diagram illustrating the semiconductor device based on the spin orbit torque (SOT) effect comprising the input circuit according to another example of the present invention.

FIG. 36 is a diagram illustrating the measurement of AHE (Anomalous Hall Effect) voltage in the semiconductor device based on the spin orbit torque (SOT) effect according to another example of the present invention.

FIG. 37 and FIG. 38 are graphs illustrating the anomalous hall effect and the magnetization switching of the first cell and the second cell of the semiconductor device of FIG. 36.

FIG. 39 is a set of graphs illustrating the input values of the first input terminal and the second input terminal of the semiconductor device of FIG. 36 and the resultant output values thereby measured at the output terminals of the first cell and the second cell.

FIG. 40 is a diagram illustrating the measurement of AHE (Anomalous Hall Effect) voltage in the semiconductor device based on the spin orbit torque (SOT) effect according to another example of the present invention.

FIG. 41 is a diagram illustrating the semiconductor device based on the spin orbit torque (SOT) effect according to another example of the present invention.

FIG. 42 is a diagram illustrating the measurement of AHE (Anomalous Hall Effect) voltage in the semiconductor device based on the spin orbit torque (SOT) effect according to another example of the present invention.

FIG. 43 is a graph illustrating the anomalous hall effect and the magnetization switching of the cell of the semiconductor device of FIG. 42.

FIG. 44 is a set of graphs illustrating the values measured at the output terminals according to the input values of the first input terminal and the second input terminal of the semiconductor device of FIG. 42.

FIG. 45 is a diagram illustrating the semiconductor device based on the spin orbit torque (SOT) effect according to another example of the present invention.

FIG. 46 is a diagram illustrating the semiconductor device based on the spin orbit torque (SOT) effect comprising the input circuit and the output circuit according to another example of the present invention.

DESCRIPTION OF THE PREFERRED EMBODIMENTS

Hereinafter, the preferable embodiments of the present invention are described with the attached drawings. However, the embodiments of the present invention can be modified and altered in various ways and the present invention is not limited to the following illustration. It is well understood by those in the art who has the average knowledge on this field that the embodiments of the present invention are given to explain the present invention more precisely. Therefore, the shape and size of the elements in the drawings may be exaggerated for clarity of illustration and the elements indicated by the same mark in the drawings are the same elements. The factors showing similar function or activity are also indicated by the same mark in all the drawings. In addition, the inclusion of an element throughout the specification does not exclude other elements, but may include other elements, unless specifically stated otherwise.

FIG. 1 is a diagram illustrating the semiconductor device (1000) based on the spin orbit torque (SOT) effect according to an example of the present invention, and FIG. 2 is a diagram illustrating the behavior of the magnetization direction of the free magnetic layer (1211, 1221) and the pinned magnetic layer (1213, 1223).

As shown in FIG. 1 and in FIG. 2, the semiconductor device (1000) based on the spin orbit torque (SOT) effect according to an example of the present invention comprises the first electrode; and the first cell and the second cell connected to the first electrode, wherein the first and the second cells are arranged on the first electrode separately and include the magnetic tunnel junction (MTJ) having a free magnetic layer and a pinned magnetic layer with a dielectric layer in between them; the magnetization direction of the free magnetic layer is changed when the current applied on the surface of the first electrode exceeds critical current value of each cell; and the critical current value of the first cell is different from that of the second cell.

The first electrode (1100) can supply current to the first cell (1210) and the second cell (1220). Particularly, the current can be spin-polarized current that controls the magnetization direction of the magnetic material. The electrical or magnetic characteristics of the first cell (1210) and the second cell (1220) can be changed by the current flowing on the first electrode (1100). Since the first electrode (1100) can change the characteristics of each cell, the first electrode plays a role as a write line in the semiconductor device (1000). And the current control switch for controlling the current applied to the first electrode can be included.

At this time, the free magnetic layer (1211, 1221) can have a perpendicular anisotropy property when the magnetization direction is arranged perpendicularly to the lamination direction. The electrical or magnetic characteristics, in particular the magnetization direction, of the free magnetic layer (1211, 1221) can be changed by the in-plane current flowing on the first electrode (1100), and the in-plane current can be controlled by the input circuit to which current is applied between the first position and the second position arranged with the first cell and the second cell in the first electrode.

The first electrode (1100) can include a conductive material. More preferably, the first electrode (1100) can include a heavy metal. When the first electrode (1100) contains a heavy metal, the magnetic characteristics such as the magnetization direction of the free magnetic layers (1211, 1221) of the first cell (1210) and the second cell (1220) can be changed. Due to the spin orbit torque, the semiconductor device (1000) according to an example of the present invention has a high speed of saving, recognizing, and transferring information, and a low energy consumption rate.

The free magnetic layer (1211, 1221) is the one that allows changes of the magnetic characteristics including the magnetization direction. The magnetic characteristics of the free magnetic layer (1211, 1221) can be altered by the surrounding electrical and magnetic properties. In addition, the perpendicular anisotropy may be applied to the lamination plane of the first electrode (1100)-free magnetic layer (1211, 1221).

The free magnetic layer (1211, 1221) can contain at least one of those materials selected from the group consisting of Fe, Co, Ni, B, Si, Pt, Pd, and the alloy thereof.

Even though current is flowing on the first electrode (1100), when the flowing current is not enough to change the magnetic characteristics of the free magnetic layer (1211, 1221), the magnetic characteristics of the free magnetic layer (1211, 1221) is not changed. Only when enough current is flowing on the first electrode (1100), the magnetic characteristics of the free magnetic layer (1211, 1221) can be changed. The current value at this time is called the critical current of the free magnetic layer (1211, 1221). That is, the electrical and magnetic characteristics of the free magnetic layers (1211, 1221) can be changed by flowing current more than the critical current on the first electrode (1100).

The magnetic characteristics of the free magnetic layers (1211, 1221) of the first cell and the second cell can be selectively changed by setting the critical current of each free magnetic layer (1211, 1221) of the first cell and the second cell differently. For example, when the critical current value of the free magnetic layer (1211) of the first cell (1210) is higher than that of the free magnetic layer (1221) of the second cell (1220), even though current lower than both of the critical current value of the free magnetic layer (1211) of the first cell (1210) and the critical current value of the free magnetic layer (1221) of the second cell (1220) is flowing on the first electrode (1100), the magnetic characteristics of both the first cell (1210) and the second cell (1220) are not changed. On the contrary, when current higher than both of the critical current value of the free magnetic layer (1211) of the first cell (1210) and the critical current value of the free magnetic layer (1221) of the second cell (1220) is flowing on the first electrode (1100), the magnetic characteristics of both the first cell (1210) and the second cell (1220) are changed. When current lower than the critical current value of the free magnetic layer (1211) of the first cell (1210) but higher than the critical current value of the free magnetic layer (1221) of the second cell (1220) is flowing on the first electrode (1100), the magnetic characteristics of the first cell (1210) are not changed but the magnetic characteristics of the second cell (1220) are changed.

As described above, the magnetic characteristics of each cell, the first cell (1210) and the second cell (1220), can be simultaneously or selectively changed by controlling the size of current flowing on the first electrode (1100).

The first cell (1210) and the second cell (1220) above can include the magnetic tunneling junction structure in which the free magnetic layer (1211, 1221) and the pinned magnetic layers (1213, 1223) are separated by the dielectric layers (1212, 1222), respectively. More precisely, the first cell (1210) and the second cell (1220) can have the dielectric layer (1212, 1222) on the free magnetic layer (1211, 1221), and have the pinned magnetic layer (1213, 1223) on the dielectric layer (1212, 1222), indicating that the free magnetic layer (1211, 1221) and the pinned magnetic layer (1213, 1223) are facing each other with the dielectric layer (1212, 1222) in between them.

The pinned magnetic layer (1213, 1223) can be the one having a fixed magnetization direction and can include a material having a magnetization direction perpendicular to the lamination plane, i.e., a material having a perpendicular anisotropy. More precisely, the pinned magnetic layer (1213, 1223) can include at least one of those materials selected from the group consisting of Fe, Co, Ni, B, Si, Zr, Pt, Pd, and the alloy thereof.

The pinned magnetic layer (1213, 1223) can also include a magnetic layer and an antiferromagnetic layer. The pinned magnetic layer (1213, 1223) above can be an artificial antiferromagnetic layer. More precisely, the pinned magnetic layer (1213, 1223) can have a three-layered artificial antiferromagnetic structure composed of magnetic layer/conductive layer/magnetic layer, wherein the antiferromagnetic layer is composed of such materials as Ir, Pt, Fe, Mn, and the alloy thereof, or Ni, Co, Fe oxide, and the alloy thereof. The artificial antiferromagnetic structure is composed of the magnetic layer comprising Fe, Co, Ni, B, Si, Zr, Pt, Pd, and the alloy thereof and the conductive layer comprising Ru, Cu, Pt, Ta, Ti, and W.

A dielectric layer (1222) can be disposed between the pinned magnetic layer (1213, 1223) and the free magnetic layer (1211, 1221). The dielectric layer (1222) plays a role in controlling current flowing between the pinned magnetic layer (1213, 1223) and the free magnetic layer (1211, 1221).

The dielectric layer (1222) can include one or more compounds selected from the group consisting of aluminum oxide, magnesium oxide, tantalum oxide, and zirconium oxide, but not always limited thereto.

The free magnetic layer (1211, 1221), the dielectric layer (1222), and the pinned magnetic layer (1213, 1223) can be formed by a general process for thin film deposition, such as atomic layer deposition (ALD), chemical vapor deposition (CVD), and physical vapor deposition (PVD). The thickness of each layer can be several nm to several tens nm, but not always limited thereto.

The pinned magnetic layer (1213, 1223) of the first cell (1210) and the second cell (1220) can be connected to the second electrode (1300). The electrical and magnetic characteristics of each cell can be determined by the second electrode (1300). Therefore, the second electrode (1300) plays a role as a read line in the semiconductor device (1000).

The second electrode (1300) can include a conductive material. The second electrode (1300) can include at least one or more materials selected from the group consisting of Ni, W, Cu, and the alloy thereof, but not always limited thereto.

As described hereinbefore, the electrical or magnetic characteristics of the first cell (1210) and the second cell (1220) can be changed by the size of the current applied to the first electrode (1100). At this time, the magnetic characteristics including the magnetization direction of the free magnetic layer (1211, 1221) of each cell can be changed. The changes of the magnetization direction of the free magnetic layer (1211, 1221) depends on the size of current flowing on the first electrode (1100) or the size of the magnetic field around.

At this time, the current flowing through the second electrode (1300) does not change the magnetic characteristics of the free magnetic layer (1211, 1221) and the pinned magnetic layer (1213, 1223) since it is not sufficient to determine the electric or magnetic characteristics of each cell.

As shown in FIG. 2, the magnetization direction of the free magnetic layer (1211) can be changed in the two different directions as indicated by the arrows facing up and down. On the other hand, the magnetization direction of the pinned magnetic layer (1213) might not be changed as indicated by the arrow facing only upward.

The semiconductor device according to an example of the present invention comprises the input circuit to which current is applied between the first position and the second position disposed between the first cell and the second cell of the first electrode; the first output circuit in which current flows from the first position of the first electrode through the first cell; and the second output circuit in which current flows from the first position of the first electrode through the second cell, wherein information is stored in the first cell or the second cell by the current applied along the input circuit and the information can be read by measuring the electrical characteristics of the first output circuit and the second output circuit.

Even though current is applied to the first electrode including the first position and the second position by the input circuit, if the current is not enough to change the magnetic characteristics of the free magnetic layer, the magnetic characteristics of the free magnetic layer are not changed. Only when enough current is flowing by the input circuit on the first electrode including the first position and the second position, the magnetic characteristics of the free magnetic layer can be changed. The current value at this time is called the critical current of the free magnetic layer. That is, the electrical and magnetic characteristics of the free magnetic layer can be changed by flowing current more than the critical current on the first electrode including the first position and the second position.

FIG. 3 shows a circuit diagram of the semiconductor device according to an example of the present invention including the input circuit, the first output circuit, and the second output circuit.

As shown in FIG. 3, the input circuit provides current between the first position and the second position arranged with the first cell and the second cell in between them on the first electrode, and can have a path that goes through the writing block, the source-line, the transistor controlling current flowing on the first electrode, the first cell, the second cell, the write-line, and going back to the writing block.

In the first output circuit, current flows from the first position of the first electrode through the first cell. The first output circuit can have a path that goes through the source-line connected to the first cell, the transistor controlling current flowing on the first electrode, the read-line connected to the first cell, and the amplifier (SA).

In the second output circuit, current flows from the first position of the first electrode through the second cell. The second output circuit can have a path that goes through the source-line connected to the first cell, the transistor controlling current flowing on the first electrode, the read-line connected to the second cell, and the amplifier (SA).

As shown in FIG. 3, the first output circuit lets out current through the source line connected to the first cell and then through the output circuit connected to the first cell. The information stored in the first cell can be read by measuring the electrical characteristics of the first cell while current is flowing through the first cell from the first position of the first electrode.

As shown in FIG. 3, the second output circuit lets out current through the source line connected to the second cell and then through the output circuit connected to the second cell. The information stored in the second cell can be read by measuring the electrical characteristics of the first cell while current is flowing through the second cell from the first position of the first electrode.

As described hereinbefore, the first cell (1210) and the second cell (1220) can include the free magnetic layer (1211, 1221) whose magnetic characteristics can be changed by source current or magnetic field. These cells can include the dielectric layer (1212, 1222) arranged on the free magnetic layer (1211, 1221), the pinned magnetic layer (1213, 1223) arranged on the dielectric layer (1212, 1222), and the second electrode (1300) connected to the pinned magnetic layer (1213, 1223). The descriptions about the free magnetic layer (1211, 1221), the dielectric layer (1212, 1222), the pinned magnetic layer (1213, 1223), the first electrode (1100), and the second electrode (1300) are same as given above.

The current applied to the first electrode (1100) is controlled by the current control switch. When the current control switch is on, current starts flowing on the first electrode (1100), and the free magnetic layers (1211, 1221) of the first cell (1210) and the second cell (1220) are affected by the current flowing on the first electrode (1100). And, the magnetization direction of the first cell (1210) and the second cell (1220) can be changed by the current provided on the first electrode.

The current control switch can be a kind that can be used to control current or voltage in the semiconductor device (1000), whose material, shape, and functions are not particularly limited. In particular, the current control switch can be a kind that is used to control current provided on the write line such as DRAM. FIG. 9 illustrates an example of the current control switch (2400).

When the current control switch is on and therefore current is flowing on the first electrode (1100) enough to change the electrical characteristics including the magnetization direction of the free magnetic layers (1211, 1221) of the first cell (1210) and the second cell (1220), the electrical characteristics of the first cell (1210) and of the second cell (1220) are changed.

When the current control switch is on, and current is flowing on the first electrode (1100) enough to change the magnetic characteristics of only one of the free magnetic layers (1211, 1221) of the first cell (1210) and the second cell (1220), the magnetic characteristics can be changed selectively either of the first cell (1210) or the second cell (1220).

When the current control switch is off, the magnetic characteristics of the first cell (1210) and of the second cell (1220) stay as changed and the information can be saved in the cell.

Once voltage is applied on the second electrode (1300) and then electrical or magnetic characteristic values of each cell are read, the information stored in each cell can be known.

In the semiconductor device (1000) based on the spin orbit torque (SOT) effect according to an example of the present invention, as described hereinbefore, the size of current enough to change the magnetic characteristics of the first cell (1210) and the second cell (1220) can be different, that is the critical current value of each cell can be different. The behavior of cells with different critical current value is described hereinafter with reference to FIGS. 4~6.

FIG. 4 is a diagram illustrating the measurement of AHE (Anomalous Hall Effect) voltage in the semiconductor device (1000) based on the spin orbit torque (SOT) effect according to an example of the present invention. FIG. 5 is a graph illustrating the state changes of the first cell (1210) and the second cell (1220) according to the magnetic field based on the measurement of FIG. 4. And FIG. 6 is a graph illustrating the state changes of the first cell (1210) and the second cell (1220) according to current based on the measurement of FIG. 4. Particularly, FIG. 5 and FIG. 6 illustrate the state changes of the free magnetic layer (1211, 1221) of each cell.

As shown in FIG. 5, the magnetization direction of the first cell (1210) and the second cell (1220) is changed separately up or down according to the size of the magnetic field, suggesting that the magnetic characteristics is different between the first cell (1210) and the second cell (1220).

As shown in FIG. 6, the magnetization direction of the first cell (1210) and the second cell (1220) is changed up or down according to the current applied on the first electrode (1100). As shown in FIG. 6, when current is applied on the first electrode (1100) and the external magnetic field exists, the changes of the anomalous hall resistance (RH) of the first cell (1210) and the second cell (1220) can be measured by arranging the first cell (1210) and the second cell (1220) with the different critical current values. The critical current of the first cell (1210) that could change the magnetization direction from up to down was −11.5 mA and the critical current that could change the magnetization direction from down to up was +9.5 mA. The critical current of the second cell (1220) that could change the magnetization direction from up to down was −13.5 mA and the critical current that could change the magnetization direction from down to up was +11.5 mA. Also, the in-plane magnetic field of 10 mT is applied to the same direction as the current direction.

FIG. 9 is a diagram illustrating the semiconductor device (2000) based on the spin orbit torque (SOT) effect according to another example of the present invention. In FIG. 9, the semiconductor device (2000) that has more numbers of cells (2210, 2220, 2230, 2240, 2250, and 2260) on the first electrode (2100) is illustrated.

As shown in FIG. 9, 6 cells (2210, 2220, 2230, 2240, 2250, and 2260) are connected to the first electrode (2100). The current applied on the first electrode (2100) is controlled by one input circuit (2400) connected to the first electrode (2100). The 6 cells (2210, 2220, 2230, 2240, 2250, and 2260) above might have different critical current values according to the magnetic characteristics. When applied current is lower than any of critical current values of 6 cells (2210, 2220, 2230, 2240, 2250, 2260) is applied on the first electrode (2100), the magnetic characteristics of those 6 cells (2210, 2220, 2230, 2240, 2250, 2260) are not changed. When applied current is higher than any of critical current values of 6 cells (2210, 2220, 2230, 2240, 2250, 2260) is applied on the first electrode (2100), the magnetic characteristics of those 6 cells (2210, 2220, 2230, 2240, 2250, 2260) are all changed. When applied current is in the range between the highest critical current value and the lowest critical current value among those of the 6 cells (2210, 2220, 2230, 2240, 2250, 2260) is applied on the first electrode (2100), the magnetic characteristics of only a few of those 6 cells (2210, 2220, 2230, 2240, 2250, 2260) are selectively changed.

At this time, the information that can be realized by the 6 cells (2210, 2220, 2230, 2240, 2250, 2260) above (for example, RH: Anomalous Hall Resistance) is as follows. When the magnetization direction of the 6 cells is initialized upward by applying current that could initialize the direction of the data upward on the write line of the semiconductor device, the possibilities of the information realization could be 8 as follows: Up-Up-Up-Up-Up-Up, Up-Up-Up-Up-Up-Down, Up-Up-Up-Up-Down-Down, Up-Up-Up-Down-Down-Down, Up-Up-Down-Down-Down-Down, Up-Down-Down-Down-Down-Down, and Down-Down- Down-Down-Down-Down. When the magnetization direction of the 6 cells is initialized downward by applying current that could initialize the direction of the data downward on the write line of the semiconductor device, the possibilities of the information realization could be 8 as follows: Down-Down-Down-Down-Down-Down, Down-Down-Down-Down-Down-Up, Down-Down-Down-Down-Up-Up, Down-Down-Down-Up-Up-Up, Down-Down-Up-Up-Up-Up, Down-Up-Up-Up-Up-Up, and Up-Up-Up-Up-Up-Up. Therefore, the information that can be realized by the 6 cells above could be 12, such as Up-Up-Up-Up-Up-Up, Up-Up-Up-Up-Up-Down, Up-Up-Up-Up-Down-Down, Up-Up-Up-Down-Down-Down, Up-Up-Down-Down-Down-Down, Up-Down-Down-Down-Down-Down, Down-Down-Down-Down-Down-Down, Down-Down-Down-Down-Down-Up, Down-Down-Down-Down-Up-Up, Down-Down-Down-Up-Up-Up, Down-Down-Up-Up-Up-Up, and Down-Up-Up-Up-Up-Up, suggesting that n number of cells could realize 2n number of information.

If one switch is connected to each cell to control the cell, the switch can control two kinds of information. The semiconductor device (2000) based on the spin orbit torque (SOT) effect according to an example of the present invention, as shown in FIG. 9, has one switch to control 6 cells, so that the switch can control 12 kinds of information. Therefore, the semiconductor device (2000) based on the spin orbit torque (SOT) effect according to an example of the present invention has higher information integrity on each cell, compared with the conventional semiconductor device having a switch per each cell. So, the semiconductor device (2000) according to an example of the present invention can be highly integrated and thereby has the effect of improving the performance and reducing the manufacturing cost of the semiconductor device (2000).

FIG. 10 is a diagram illustrating the semiconductor device (3000) based on the spin orbit torque (SOT) effect according to another example of the present invention. As shown in FIG. 10, the first electrode (3100) can be divided into the upper electrode (3110) and the lower electrode (3120). The upper electrode of the first electrode can contain a heavy metal, particularly tantalum (Ta), and the lower electrode of the first electrode is arranged on the lower electrode and can contain an antiferromagnetic material such as iridium-manganese (IrMn).

FIG. 11 is a graph illustrating the changes of the magnetization direction of the free magnetic layer (3211) of the semiconductor device (3000) of FIG. 10 by the current applied to the first electrode (3100) in the magnetic field free environment. In the semiconductor device shown in FIG. 10, the lower electrode of the first electrode (3100) comprises tantalum (Ta), and the lower electrode comprises iridium-manganese (IrMn). The free magnetic layer (3211) comprises CoFeB, while the dielectric layer (3212) comprises MgO.

Anomalous hall resistance (RH) was measured after applying current onto the first electrode (3110) of the semiconductor device (3100). As shown in FIG. 11, the magnetic characteristics of the free magnetic layer (3211) could be more easily changed without the external magnetic field applied thereon by arranging the first ferromagnetic layer containing a magnetic material on the lower electrode comprising an antiferromagnetic material.

The method to control the semiconductor device based on the spin orbit torque (SOT) effect comprising the input circuit to which current is applied between the first position and the second position of the first electrode; the first cell and the second cell including a magnetic tunneling junction (MTJ) disposed on the first electrode and having a free magnetic layer and a pinned magnetic layer disposed between the dielectric layer; the first output circuit in which current flows from the first position of the first electrode through the first cell; and the second output circuit in which current flows from the first position of the first electrode through the second cell according to an example of the present invention comprises the step of storing information in the first cell by applying current on the first electrode by operating the input circuit; and the step of storing information in the second cell by flowing current on the first electrode by operating the input circuit.

In the step of storing information in the first cell by applying current on the first electrode by operating the input circuit, the current can be the spin-polarized current controlling the magnetization direction of the magnetic material, and the electrical or magnetic characteristics of the first cell can be changed by the current applied on the first electrode.

In the step of storing information in the second cell by applying current on the first electrode by operating the input circuit, the current can be the spin-polarized current controlling the magnetization direction of the magnetic material, and the electrical or magnetic characteristics of the second cell can be changed by the current applied on the first electrode.

The first cell and the second cell above can have different critical current values necessary for storing information.

The method to control the semiconductor device based on the spin orbit torque (SOT) effect according to an example of the present invention can include an additional step of reading the information stored in the first cell and the second cell by applying current on the first output circuit and the second output circuit.

In the step of reading the information stored in the first cell and the second cell by applying current on the first output circuit and the second output circuit, the second magnetic layer (1213, 1223) of the first cell (1210) and the second cell (1220) can be connected to the second electrode (1300) and the electrical and magnetic characteristics of each cell can be determined by the second electrode (1300).

FIG. 7 and FIG. 8 illustrate the method to control the multiple cells included in the semiconductor device (1000) based on the spin orbit torque (SOT) effect of FIG. 4 by a current control switch.

FIG. 7 and FIG. 8 illustrate the changes of the magnetization direction of the semiconductor device (1000) based on the spin orbit torque (SOT) effect of FIG. 4. FIG. 7 illustrates the changes of the magnetization direction of the total cells according to the magnetic field. FIG. 8 illustrates the changes of the magnetization direction of the total cells, wherein the anomalous hall resistance was changed by changing current flowing on the first electrode. Also, the in-plane magnetic field of 10 mT is applied to the same direction as the current direction. Particularly, FIG. 7 and FIG. 8 illustrate the changes of the magnetization direction of the free magnetic layer.

As shown in FIG. 8, when −13.5 mA of current was applied on the first electrode (1100) of the semiconductor device (1000) based on the spin orbit torque (SOT) effect, the magnetization direction of the first cell (1210) and the second cell (1220) was changed downward. This was because the current applied thereto, −13.5 mA, was the same as or bigger than the critical current value of the first cell (1210) and the second cell (1220) having the direction changed from upward to downward. Next, when +9.5 mA of current was applied on the first electrode (1100), the magnetization direction of the first cell (1210) alone was changed from downward to upward. This was because the applied current, +9.5 mA, was similar to the critical current value of the first cell (1210) having the direction changed from downward to upward but was smaller than the critical current value of the second cell (1220) having the direction changed from downward to upward. When +11.5 mA of current was applied on the first electrode (1100), the magnetization direction of the second cell (1220) was changed from downward to upward. This was because the applied current, +11.5 mA, was the same as or bigger than the critical current value of the first cell (1210) and the second cell (1220) having the direction changed from downward to upward. When −11.5 mA of current was applied on the first electrode (1100), the magnetization direction of the first cell (1210) alone was changed from upward to downward. This was because the applied current, −11.5 mA, was corresponding to the critical current of the first cell (1210) having the direction changed from upward to downward but was smaller than the critical current value of the second cell (1220) having the direction changed from upward to downward. When −13.5 mA of current was applied on the first electrode (1100), the magnetization direction of both of the first cell (1210) and the second cell (1220) was changed from upward to downward. When +9.5 mA of current was applied on the first electrode (1100), the magnetization direction of the first cell (1210) alone was changed from downward to upward. Therefore, by controlling the magnetization direction of each cell, the value of the anomalous hall resistance (RH) of the semiconductor device (1000) can be multilevel. Also, the in-plane magnetic field of 10 mT is applied to the same direction as the current direction.

As described hereinbefore, as shown in FIG. 7 and FIG. 8, a multilevel anomalous hall resistance (RH) can be realized by controlling current flowing on the first electrode (1100) in the semiconductor device (1000) including a plurality of cells connected to the first electrode (1100).

FIG. 12 is a diagram illustrating the semiconductor device (6000) based on the spin orbit torque (SOT) effect according to another example of the present invention. As shown in FIG. 12, the semiconductor device (6000) based on the spin orbit torque (SOT) effect according to another example of the present invention comprises the first electrode; the cell including a magnetic tunneling junction (MTJ) disposed on the first electrode and having a free magnetic layer and a pinned magnetic layer interposed between a dielectric layer; and the cell control electrode to apply voltage between the free magnetic layer and the pinned magnetic layer electrically connected to the cell, wherein the critical current value of the cell is controlled by the voltage applied by the cell control electrode.

The first electrode, the dielectric layer, the free magnetic layer, and the pinned magnetic layer can be the same as the first electrode, the dielectric layer, the free magnetic layer, and the pinned magnetic layer above.

At this time, the gate dielectric layer (6610, 6620) can be additionally included in between the cell control electrode (6510, 6520) and the cell (6210, 6220).

When the voltage applied by the cell control electrode (6510, 6520) exceeds a certain level, the electrical or magnetic characteristics of the cell (6210, 6220) can be changed.

The cell (6210, 6220) contains a material and a composition that can be changed in their electrical or magnetic characteristics by the voltage applied by the cell control electrode (6510, 6520). The electrical or magnetic characteristics herein can be the size of the critical current to change the magnetization direction of the cell (6210, 6220).

The conditions necessary for storing information in the cell (6210, 6220) can be changed by the properties of the cell (6210, 6220) to be changed by the voltage applied by the cell control electrode (6510, 6520). For example, the critical current value to change the magnetization direction of the cell (6210, 6220) can be changed by applying voltage to the cell (6210, 6220). At this time, even though a certain level of current is applied to the write line, the magnetization direction of the cell (6210, 6220) might not be changed. That is, the condition for writing in the cell (6210, 6220) can be modified and thereby the value and volume of current applied to the write line of the semiconductor device can be changed.

The cells above are at least two of them, and the electrical characteristics of each cell (6210, 6220) can be controlled by the voltage applied by the cell control electrode (6510, 6520) connected to each cell (6210, 6220). The current value can be set differently with each cell in order to input information in the cell (6210, 6220) by applying different levels of voltage to each cell (6210, 6220) by the voltage applied through the cell control electrode (6510, 6520).

The cell (6210, 6220) includes the free magnetic layer (6211, 6221). The voltage applied to the cell control electrode (6510, 6520) can regulate the electrical or magnetic characteristics of the free magnetic layer (6211, 6221). As shown in FIG. 12, the semiconductor device (6000) according to an example of the present invention comprises the first electrode (6100); the cell (6210, 6220) containing the free magnetic layer (6211, 6221) which is connected electrically to the first electrode (6100); the dielectric layer (6610, 6620) arranged on the free magnetic layer (6211, 6221); and the cell control electrode (6510, 6520) arranged on the dielectric layer (6610, 6620).

The electrical or magnetic characteristics of the free magnetic layer (6211, 6221) can be changed by the voltage applied to the cell control electrode (6510, 6520). The characteristics of each cell (6210, 6220) can be changed by each cell control electrode (6510, 6520).

The semiconductor device (6000) based on the spin orbit torque (SOT) effect according to another example of the present invention can additionally include the input circuit to which current is applied between the first position and the second position arranged with the cell in between them in the first electrode; and the voltage circuit for applying voltage between the free magnetic layer and the pinned magnetic layer.

FIG. 13 is a diagram illustrating the input circuit and the voltage circuit of the semiconductor device based on the spin orbit torque (SOT) effect according to another example of the present invention.

The input circuit can apply current to the first electrode containing the first position and the second position, and can control the size of the current applied thereto.

As shown in FIG. 13, the input circuit provides current between the first position and the second position arranged with the cell in between them on the first electrode, and can have a path that goes through the writing block, the source-line, the transistor controlling current flowing on the first electrode, the first cell, the write-line, and going back to the writing block.

Even though current is applying to the first electrode containing the first position and the second position, when the flowing current is not enough to change the magnetic characteristics of the free magnetic layer, the magnetic characteristics of the free magnetic layer is not changed. Only when enough current is flowing on the first electrode, the magnetic characteristics of the free magnetic layer can be changed. The current value at this time is called the critical current of the free magnetic layer. That is, the electrical or magnetic characteristics of the free magnetic layers can be changed by flowing current more than the critical current on the first electrode containing the first position and the second position.

A current control switch can be additionally included therein in order to control the current applied on the input circuit.

The voltage circuit can apply voltage between the free magnetic layer and the pinned magnetic layer of the cell, and the critical current value of each cell can be controlled by regulating the electric level of each cell.

As shown in FIG. 13, the voltage circuit can turn on the transistor connected to the second electrode of the cell through the first bit-line to apply voltage between the free magnetic layer and the pinned magnetic layer of the cell. At this time, the voltage circuit is composed of the writing block, the source-line, the first electrode, the cell, and the read-line.

FIG. 14 is a schematic diagram illustrating the experiment to measure anomalous hall resistance of the semiconductor device of FIG. 12. FIG. 15~FIG. 17 are graphs illustrating the anomalous hall resistance measured according to FIG. 14.

In FIG. 14, the first electrode (6100) was formed in the thickness of 5 nm using Ta. The first cell and the second cell (6610, 6620) containing the free magnetic layer were formed in the thickness of 1 nm using CoFeB. The dielectric layer was formed in the thickness of 1.6 nm, 1.5 nm, and 40 nm with MgO, $AlO_x$, and $ZrO_x$ respectively on the first cell and the second cell (6610, 6620). The first cell and the second cell control electrodes (6510, 6520) were formed by using Ru. In FIG. 14, $V_{G1}$ and $V_{G2}$ were applied on the cell control electrode (6510, 6520) arranged on each cell (6210, 6220), and then current was applied on the first electrode (6100). $V_{G1}$ and $V_{G2}$ were applied in the range of –tens of V to +tens of V. Also, the in-plane magnetic field of 10 mT is applied to the same direction as the current direction.

As shown in FIG. 15~FIG. 17, when +voltage was applied on the first cell and the second cell control electrodes (6510, 6520), coercivity ($H_C$) and critical current ($J_C$) were reduced, while –voltage was applied, coercivity ($H_C$) and critical current ($J_C$) were increased. The coercivity ($H_C$) and critical current ($J_C$) changed by $V_{G1}$ and $V_{G2}$ had non-volatile characteristics that were maintained even when $V_{G1}$ and $V_{G2}$ were removed. Therefore, the electrical and magnetic characteristics of each cell can be controlled by the voltage applied on the cell control electrode.

FIG. 18 is a diagram illustrating the semiconductor device based on the spin orbit torque (SOT) effect according to another example of the present invention. As shown in FIG. 18, the semiconductor device (7000) based on the spin orbit torque (SOT) effect according to another example of the present invention comprises the first electrode (7100); the cell electrically connected to the first electrode (7100) and comprising the free magnetic layer (7211, 7221), the dielectric layer (7212, 7222) arranged on the free magnetic layer (7211, 7221), and the pinned magnetic layer (7213, 7223) arranged on the dielectric layer (7212, 7222); and the cell control electrode (7510, 7520) arranged on the pinned magnetic layer (7213, 7223). At this time, the dielectric layer (7212, 7222) arranged under the pinned magnetic layer (7213, 7223) acts as the gate dielectric layer. The cell control electrode (7510, 7520) provides current to the pinned magnetic layer (7213, 7223), and then the electrical or magnetic characteristics of the free magnetic layer (7211, 7221) can be changed by the voltage applied on the pinned magnetic layer (7213, 7223). That is, the characteristics of each cell (7210, 7220) can be changed by the cell control electrode (7510, 7520).

The change of the electrical or magnetic characteristics of the free magnetic layer (7211, 7221) by the voltage applied on the pinned magnetic layer (7213, 7223) of the semiconductor device having the structure of FIG. 18 has been proved by the earlier studies performed by Wei-Gang Wang et al (Electric-field-assisted switching in magnetic tunnel junctions, Nature Materials, Volume: 11, Pages: 64-68, Year published: (2012)). According to the research paper presented by them, they constructed an experimental cell having the structure shown in FIG. 19. In the experiment, the experimental cell (8000) was composed of the free magnetic layer (8100), the dielectric layer (8200) arranged on the free magnetic layer (8100), and the pinned magnetic layer (8300) arranged on the dielectric layer (8200). The free magnetic layer (8100) was formed with CoFeB in the thickness of 1.3 nm, and the dielectric layer (8200) was formed with MgO in the thickness of 1.4 nm. The pinned magnetic layer (8300) was formed with CoFeB in the thickness of 1.6 nm. The electrode was connected to each of the free magnetic layer (8100) and the pinned magnetic layer (8300) and then voltage was applied on the pinned magnetic layer (8300). At this time, the pinned magnetic layer (8300) played as the gate electrode and the dielectric layer (8200) acted as the gate oxide film by which the electrical and magnetic characteristics of the free magnetic layer (8100) were changed.

According to FIG. 12 and FIG. 18, the first electrode can include a conductive material. More preferably, the first electrode can include a heavy metal. When the first electrode contains a heavy metal, the magnetic characteristics such as the magnetization direction of the free magnetic layer of the cell can be changed. Due to the spin orbit torque, the semiconductor device according to an example of the present invention has a high speed of saving, recognizing, and transferring information, and a low energy consumption rate.

The free magnetic layer can be the one that allows changes of the magnetic characteristics including the magnetization direction. The magnetic characteristics of the free magnetic layer can be altered by the surrounding electrical and magnetic properties. In addition, the perpendicular anisotropy may be applied to the lamination plane of the first electrode-free magnetic layer.

The free magnetic layer can contain at least one of those materials selected from the group consisting of Fe, Co, Ni, B, Si, Pt, Pd, and the alloy thereof.

At this time, the free magnetic layer can have a perpendicular anisotropy property when the magnetization direction is arranged perpendicularly to the lamination direction. The electrical or magnetic characteristics, in particular the magnetization direction, of the free magnetic layer can be changed by the in-plane current flowing on the first electrode.

Even though current is flowing on the first electrode, when the flowing current is not enough to change the magnetic characteristics of the free magnetic layer, the magnetic characteristics of the free magnetic layer is not changed. Only when enough current is flowing on the first electrode, the magnetic characteristics of the free magnetic layer can be changed. The current value at this time is called the critical current of the free magnetic layer. That is, the electrical or magnetic characteristics of the free magnetic layer can be changed by flowing current more than the critical current on the first electrode.

As shown in FIG. 18, at least two of those cells can include the magnetic tunneling junction structure in which the free magnetic layer (7211, 7221) and the pinned magnetic layers (7213, 7223) are separated by the dielectric layers (7212, 7222), respectively. More precisely, at least two of those cells can include the dielectric layer (7212, 7222) on the free magnetic layer, and include the pinned magnetic layer on the dielectric layer, indicating that the free magnetic layer and the pinned magnetic layer are facing each other with the dielectric layer in between them.

The pinned magnetic layer can be the one having a fixed magnetization direction and can include a material having a magnetization direction perpendicular to the lamination plane, i.e., a material having a perpendicular anisotropy. More precisely, the pinned magnetic layer can include at least one of those materials selected from the group consisting of Fe, Co, Ni, B, Si, Zr, Pt, Pd, and the alloy thereof.

The pinned magnetic layer can also include a magnetic layer and an antiferromagnetic layer. The pinned magnetic layer above can be an artificial antiferromagnetic layer. More precisely, the pinned magnetic layer can have a three-layered artificial antiferromagnetic structure composed of magnetic layer/conductive layer/magnetic layer, wherein the antiferromagnetic layer is composed of such materials as Ir, Pt, Fe, Mn, and the alloy thereof, or $NiO_x$, $CoO_x$, and $FeO_x$. The artificial antiferromagnetic structure is composed of the magnetic layer comprising Fe, Co, Ni, B, Si, Zr, Pt, Pd, and the alloy thereof and the conductive layer comprising Ru, Cu, Pt, Ta, Ti, and W.

As shown in FIG. 18, a dielectric layer can be disposed between the pinned magnetic layer and the free magnetic layer. The dielectric layer plays a role in controlling current flowing between the pinned magnetic layer and the free magnetic layer.

The dielectric layer can include one or more compounds selected from the group consisting of aluminum oxide, magnesium oxide, tantalum oxide, and zirconium oxide, but not always limited thereto.

As shown in FIG. 12 and FIG. 18, the pinned magnetic layer of at least two of those cells can be connected to the second electrode. The electrical and magnetic characteristics of each cell can be determined by the second electrode. Therefore, the second electrode plays a role as a read line in the semiconductor device.

The second electrode can include a conductive material. The second electrode can include at least one or more materials selected from the group consisting of Ni, W, Cu, Ru, and the alloy thereof, but not always limited thereto.

FIG. 21 is a diagram illustrating the semiconductor device (5000) based on the spin orbit torque (SOT) effect according to another example of the present invention. As shown in FIG. 21, 6 cells are connected to the first electrode (5100) and the current applied on the first electrode (5100) is controlled by one current control switch (5400) connected on the first electrode (5100). The 6 cells above might have different critical current values to change the magnetic characteristics by the voltage applied through the cell control electrodes (5510, 5520, 5530, 5540, 5550, and 5560) connected to each cell. When applied current is lower than any of critical current values of 6 cells (5210, 5220, 5230, 5240, 5250, 5260) is applied on the first electrode (5100), the magnetic characteristics of those 6 cells (5210, 5220, 5230, 5240, 5250, 5260) are not changed. When applied current is higher than any of critical current values of 6 cells than the biggest critical current value among those of the 6 cells (5210, 5220, 5230, 5240, 5250, 5260) is applied on the first electrode (5100), the magnetic characteristics of those 6 cells (5210, 5220, 5230, 5240, 5250, 5260) are all changed. When current is in the range between the highest critical current value and the lowest critical current value among those of the 6 cells (5210, 5220, 5230, 5240, 5250, 5260) is applied on the first electrode (5100), the magnetic characteristics of only a few of those 6 cells (5210, 5220, 5230, 5240, 5250, 5260) are selectively changed.

At this time, the number of information to be realized (for example, RH: Anomalous Hall Resistance) by the 6 cells (5210, 5220, 5230, 5240, 5250, 5260) can be 64 in total ($2^n$). Unlike the case shown in FIG. 9, the information integrity is high because the electric or magnetic characteristics of each cell can be controlled by using the voltage applied through the cell control electrodes (5510, 5520, 5530, 5540, 5550, and 5560).

FIG. 20 is a diagram illustrating the semiconductor device (4000) based on the spin orbit torque (SOT) effect according to another example of the present invention. As shown in FIG. 20, the semiconductor device (4000) according to another example of the present invention comprises the first electrode (4100); the cell (4210, 4220) connected to the first electrode (4100); and the cell control electrode (4510, 4520) connected to the cell (4210, 4220) to control the electrical or magnetic characteristics of the cell (4210, 4220). At this time, the cell control circuit can be additionally included to control the voltage applied on the cell control electrode (4510, 4520). The dielectric layer (4610, 4620) can additionally included in between the cell control electrode (4510, 4520) and the cell (4210, 4220).

The cell (4210, 4220) contains the free magnetic layer (4211, 4221), and the cell control electrode (4510, 4520) can regulate the electrical or magnetic characteristics of the free magnetic layer (4211, 4221). The magnetization direction of the cell (4210, 4220) can also be controlled by the current flowing on the first electrode (4100). The input circuit controlling current flowing to the first electrode (4100) can also be included.

The cell control electrode (4510, 4520) can change the electrical or magnetic characteristics of each cell (4210, 4220). The cell control electrode (4510, 4520) above can apply voltage to each cell (4210, 4220). When the voltage provided on the cell control electrode (4510, 4520) exceeds a certain level, the electrical or magnetic characteristics of the cell (4210, 4220) can be changed.

The cell (4210, 4220) can include a material and a composition that can be changed in their electrical or magnetic characteristics by the voltage applied on the cell control electrode (4510, 4520). The characteristics of the cell (4210, 4220) that can be changed by the cell control electrode (4510, 4520) can be the size of the critical current to change the magnetization direction of each cell (4210, 4220).

The conditions required for inputting information to the cell (4210, 4220) can be changed by the characteristics of the cell (4210, 4220) changed by the cell control electrode (4510, 4520). For example, by applying voltage to the cell (4210, 4220) through the cell control electrode (4510, 4520), the critical current value to change the magnetization direction of the cell (4210, 4220) can be changed. At this time, even though a certain level of current is applied on the write line, the magnetization direction of the cell (4210, 4220) might not be changed. The conditions for the writing of the cell (4210, 4220) can be changed and thereby the current value and capacity applied on the write line of the semiconductor device (4000) can be controlled.

The cells (4210, 4220) above are at least two of them, and the electrical characteristics of each cell (4210, 4220) can be controlled by the voltage applied by the cell control electrode (4510, 4520) connected to each cell (4210, 4220). The current value can be set differently with each cell in order to input information in the cell (4210, 4220) by applying different levels of voltage to each cell (4210, 4220) by the voltage applied through the cell control electrode (4510, 4520).

The first electrode (4100) can include a conductive material. More preferably, the first electrode (4100) can include a heavy metal. When the first electrode (4100) contains a heavy metal, the magnetic characteristics such as the magnetization direction of the free magnetic layers (4211, 4221) of the cell (4210, 4220) can be changed. Due to the spin orbit torque, the semiconductor device (4000) according to an example of the present invention has a high speed of saving, recognizing, and transferring information, and a low energy consumption rate.

The free magnetic layer (4211, 4221) is the one that allows changes of the magnetic characteristics including the magnetization direction. The magnetic characteristics of the free magnetic layer (4211, 4221) can be altered by the surrounding electrical and magnetic properties. In addition, the perpendicular anisotropy may be applied to the lamination plane of the first electrode (4100)-free magnetic layer (4211, 4221).

The free magnetic layer (4211, 4221) can contain at least one of those materials selected from the group consisting of Fe, Co, Ni, B, Si, Pt, Pd, and the alloy thereof.

At this time, the free magnetic layer (4211, 4221) can have a perpendicular anisotropy property when the magnetization direction is arranged perpendicularly to the lamination direction. The electrical or magnetic characteristics, in particular the magnetization direction, of the free magnetic layer (4211, 4221) can be changed by the in-plane current flowing on the first electrode (4100).

Even though current is flowing on the first electrode (4100), when the flowing current is not enough to change the magnetic characteristics of the free magnetic layer (4211, 4221), the magnetic characteristics of the free magnetic layer (4211, 4221) is not changed. Only when enough current is flowing on the first electrode (4100), the magnetic characteristics of the free magnetic layer (4211, 4221) can be changed. The current value at this time is called the critical current of the free magnetic layer (4211, 4221). That is, the electrical and magnetic characteristics of the free magnetic layers (4211, 4221) can be changed by flowing current more than the critical current on the first electrode (4100).

The magnetic characteristics of the free magnetic layers (4211, 4221) of those two or more cells (4210, 4220) can be selectively changed by setting the critical current of each free magnetic layer (4211, 4221) of those two or more cells (4210, 4220) differently using the cell control electrode (4510, 4520).

Those two or more cells (4210, 4220) can include the magnetic tunneling junction structure in which the free magnetic layer (4211, 4221) and the pinned magnetic layers (4213, 4223) are separated by the dielectric layers (4212, 4222), respectively. More precisely, those two or more cells (4210, 4220) can have the dielectric layer (4212, 4222) on the free magnetic layer (4211, 4221), and have the pinned magnetic layer (4213, 4223) on the dielectric layer (4212, 4222), indicating that the free magnetic layer (4211, 4221) and the pinned magnetic layer (4213, 4223) are facing each other with the dielectric layer (4212, 4222) in between them.

The pinned magnetic layer (4213, 4223) can be the one having a fixed magnetization direction and can include a material having a magnetization direction perpendicular to the lamination plane, i.e., a material having a perpendicular anisotropy. More precisely, the pinned magnetic layer (4213, 4223) can include at least one of those materials selected from the group consisting of Fe, Co, Ni, B, Si, Zr, Pt, Pd, and the alloy thereof.

The pinned magnetic layer (4213, 4223) can also include a magnetic layer and an antiferromagnetic layer. The pinned magnetic layer (4213, 4223) above can be an artificial antiferromagnetic layer. More precisely, the pinned magnetic layer (4213, 4223) can have a three-layered artificial antiferromagnetic structure composed of magnetic layer/conductive layer/magnetic layer, wherein the antiferromagnetic layer is composed of such materials as Ir, Pt, Fe, Mn, and the alloy thereof, or Ni, Co, Fe oxide, and the alloy thereof. The artificial antiferromagnetic structure is composed of the magnetic layer comprising Fe, Co, Ni, B, Si, Zr, Pt, Pd, and the alloy thereof and the conductive layer comprising Ru, Cu, Pt, Ta, Ti, and W.

A dielectric layer (4212, 4222) can be disposed between the pinned magnetic layer (4213, 4223) and the free magnetic layer (4211, 4221). The dielectric layer (4212, 4222) plays a role in controlling current flowing between the pinned magnetic layer (4213, 4223) and the free magnetic layer (4211, 4221).

The dielectric layer (4212, 4222) can include one or more compounds selected from the group consisting of aluminum oxide, magnesium oxide, tantalum oxide, and zirconium oxide, but not always limited thereto.

In the method to control the semiconductor device based on the spin orbit torque (SOT) effect comprising the input circuit to which current is applied to the first electrode including the first position and the second position, the cell including the magnetic tunneling junction (MTJ) disposed between the first and second positions in which the magnetization direction of the free magnetic layer is changed by the write current applied by the write current circuit, and the write voltage circuit for applying voltage between the free magnetic layer and the pinned magnetic layer disposed between the free magnetic layer and the dielectric layer, the step of operating the write voltage circuit to apply voltage between the pinned magnetic layer and the free magnetic layer to change the critical current value of the cell; and the step of storing information in the cell by operating the input circuit to apply current to the first electrode and thus to change the magnetization direction of the free magnetic layer are included.

In the step of operating the voltage circuit to apply voltage between the pinned magnetic layer and the free magnetic layer to change the critical current value of the cell, the critical current value of each cell to change the magnetic characteristics by the voltage applied by the voltage circuit connected to each cell can be set differently.

In the step of storing information in the cell by applying current on the first electrode by operating the input circuit, current is applied through the input circuit set with the different critical current value to change the magnetic characteristics by the voltage applied by the voltage circuit connected to each cell and accordingly information can be stored in each cell.

Therefore, in the semiconductor device (5000) according to the present invention, the electrical or magnetic characteristics can be changed by operating the voltage circuit and thereby the characteristics of the semiconductor device can also be controlled by a user as desired.

FIG. 22 is a diagram illustrating the semiconductor device based on the spin orbit torque (SOT) effect according to an example of the present invention.

As shown in FIG. 22, the semiconductor device (9000) based on the spin orbit torque (SOT) effect according to an example of the present invention comprises the first electrode (9100); the cell (9210) including a magnetic tunneling junction (MTJ) in which a free magnetic layer (9211) and a pinned magnetic layer (9214) are disposed with a structure wherein a dielectric layer (9212) and a control layer (9213) are neighbored; and the control voltage gate for applying voltage between the free magnetic layer and the pinned magnetic layer, wherein the control layer controls the electric level of the interface of the free magnetic layer and the dielectric layer by the voltage applied to the control voltage gate and as the control layer controls the electric level, the critical current value of the cell is controlled.

The first electrode (9100) can supply current to the cell (9210) containing the magnetic tunneling junction (MTJ: magnetic Tunnel Junction). Particularly, the current can be spin-polarized current that controls the magnetization direction of the magnetic material. The electrical or magnetic characteristics of the cell (9210) can be changed by the current flowing on the first electrode (9100). Since the first electrode (9100) can change the characteristics of each cell, the first electrode plays a role as a write line in the semiconductor device.

At this time, the free magnetic layer (9211) can have a perpendicular anisotropy property when the magnetization direction is arranged perpendicularly to the lamination direction. The electrical or magnetic characteristics, in particular the magnetization direction, of the free magnetic layer can be changed by the in-plane current flowing on the first electrode.

The first electrode (9100) can include a conductive material. More preferably, the first electrode can include a heavy metal. When the first electrode contains a heavy metal, the magnetic characteristics such as the magnetization direction of the free magnetic layer of the cell containing the magnetic tunneling junction (MTJ) can be changed. Due to the spin orbit torque, the semiconductor device according to an example of the present invention has a high speed of saving, recognizing, and transferring information, and a low energy consumption rate.

The free magnetic layer (9211) is the one that allows changes of the magnetic characteristics including the magnetization direction. The magnetic characteristics of the free magnetic layer can be altered by the surrounding electrical and magnetic properties. In addition, the perpendicular anisotropy may be applied to the lamination plane of the first electrode (9100)-free magnetic layer (9211).

The free magnetic layer (9211) can contain at least one of those materials selected from the group consisting of Fe, Co, Ni, B, Si, Pt, Pd, and the alloy thereof.

Even though current is flowing on the first electrode (9100), when the flowing current is not enough to change the magnetic characteristics of the free magnetic layer (9211), the magnetic characteristics of the free magnetic layer is not changed. Only when enough current is flowing on the first electrode, the magnetic characteristics of the free magnetic layer can be changed. The current value at this time is called the critical current of the free magnetic layer. That is, the electrical and magnetic characteristics of the free magnetic layer can be changed by flowing current more than the critical current on the first electrode.

The pinned magnetic layer (9214) can include a material having a magnetization direction perpendicular to the lamination plane, i.e., a material having a perpendicular anisotropy. More precisely, the pinned magnetic layer can include at least one of those materials selected from the group consisting of Fe, Co, Ni, B, Si, Zr, Pt, Pd, and the alloy thereof.

The pinned magnetic layer (9214) can also include a magnetic layer and an antiferromagnetic layer. The pinned magnetic layer above can be an artificial antiferromagnetic layer. More precisely, the pinned magnetic layer can have a three-layered artificial antiferromagnetic structure composed of magnetic layer/conductive layer/magnetic layer, wherein the antiferromagnetic layer is composed of such materials as Ir, Pt, Fe, Mn, and the alloy thereof, or Ni, Co, Fe oxide, and the alloy thereof. The artificial antiferromagnetic structure is composed of the magnetic layer comprising Fe, Co, Ni, B, Si, Zr, Pt, Pd, and the alloy thereof and the conductive layer comprising Ru, Cu, Pt, Ta, Ti, and W.

A dielectric layer (9212) can be disposed between the pinned magnetic layer (9214) and the free magnetic layer (9211). The dielectric layer (9212) plays a role in controlling current flowing between the pinned magnetic layer and the free magnetic layer.

The dielectric layer (9212) can include one or more compounds selected from the group consisting of aluminum oxide, magnesium oxide, tantalum oxide, and zirconium oxide, but not always limited thereto.

The free magnetic layer (9211) and the pinned magnetic layer (9214) can be formed by a general process for thin film deposition, such as atomic layer deposition (ALD), chemical vapor deposition (CVD), and physical vapor deposition (PVD). The thickness of each layer can be several nm to several tens nm, but not always limited thereto.

The control layer (9213) may preferably be a structure bonded to the dielectric layer. The control layer can be arranged close to the dielectric layer or the free magnetic layer.

The dielectric layer (9213) can include one or more compounds selected from the group consisting of magnesium oxide, tantalum oxide, and zirconium oxide, but not always limited thereto.

The control layer (9213) can be an oxide, preferably selected from the group consisting of aluminum oxide ($AlO_x$), titanium oxide ($TiO_x$), and tantalum oxide ($TaO_x$), but always limited thereto.

The oxidation time for the control layer (9213) is 25~125 seconds.

The control layer (9213) can be prepared with a metal layer by oxidizing the metal layer. The oxidation time is 25~125 seconds. The level of oxidation of the control layer can be regulated by adjusting the oxidation time in the course of the preparation of the control layer. The magnetic anisotropy of the free magnetic layer can be changed according to the level of oxidation.

The control voltage gate can apply voltage between the free magnetic layer and the pinned magnetic layer. The control layer controls the electric level of the interface between the free magnetic layer and the dielectric layer by the voltage applied on the control voltage gate, and the critical current value of each cell is controlled by regulating the electric level by the control layer.

To regulate the voltage applied on the control voltage gate, a control voltage gate switch can be additionally included. The control voltage gate switch can have the composition of the conventional switch used to control the flow of voltage in a semiconductor.

The voltage gate is the component to apply voltage between the free magnetic layer (9211) and the pinned magnetic layer (9214), which can be the pinned magnetic layer (9214) and can be the second electrode (9300) connected to the pinned magnetic layer (9214).

If the voltage applied by the control voltage gate exceeds a certain level, the electrical or magnetic characteristics of the cell containing the magnetic tunneling junction can be changed.

The cell (9210) containing the magnetic tunneling junction can include a material and a composition that can be changed in their electrical or magnetic characteristics by the voltage applied by the control voltage gate. The electrical or magnetic characteristics of the cell (9210) can be changed by the size of the critical current to change the magnetization direction of the cell containing the magnetic tunneling junction.

The critical current value to change the magnetization direction of the cell (9210) containing the magnetic tunneling junction can be changed by applying voltage to the cell containing the magnetic tunneling junction.

As an example, the electric level of the interface between the free magnetic layer (9211) and the dielectric layer (9212) can be controlled by the voltage applied on the control voltage gate. At this time, the control layer (9213) controls the electric level of the interface between the free magnetic layer and the dielectric layer by the voltage applied on the control voltage gate and the critical current value of each cell is controlled by regulating the electric level by the control layer (9213).

FIG. 23 is a diagram illustrating the measurement of AHE (Anomalous Hall Effect) voltage in the semiconductor device based on the spin orbit torque (SOT) effect according to an example of the present invention.

As shown in FIG. 23, the semiconductor device was constructed with the structure of substrate (oxidized silicon)-first electrode (Ta (5 nm))/free magnetic layer ($Co_{32}Fe_{48}B_{20}$ (CoFeB, 1 nm))/dielectric layer (MgO, 1.6 nm)/control layer ($AlO_x$(1.8 nm)), wherein ruthenium (Ru) was deposited as the second electrode on the control layer.

The metal layer was grown by d.c. sputtering under the operating pressure of 0.4 Pa (3 mTorr) and the MgO layer was deposited by RF sputtering (150 W) with MgO under the pressure of 1.33 Pa (10 mTorr). $AlO_x$ was formed by depositing a 1.5 nm metal Al layer and then exposed to $O_2$ plasma over various oxidation times ($t_{ox}$) at the power of 30 watts under the pressure of 4 Pa (30 mTorr).

To increase the perpendicular magnetic anisotropy, heat treatment was performed at 250° C. under vacuum for about 40 minutes.

The oxidation time of the control layer (9213) was adjusted to 25~125 seconds, and the magnetic anisotropy dependency of the control layer according to the voltage polarity was measured according to the oxidation time of the control layer (9213).

FIG. 24~FIG. 26 are graphs illustrating the changes of anomalous hall effect against the magnetic field according to the oxidation time of the control layer (9213) in the semiconductor device of FIG. 23.

As shown in FIG. 24, when the oxidation time of the control layer (aluminum oxide) was 25 seconds, the slope of anomalous hall effect which decreases according to the in-plane magnetic field ($B_x$) was bigger when the voltage applied by the control voltage gate was +(22V) than when the voltage applied by the control voltage gate was −(−20 V). As shown in FIG. 25, when the oxidation time of the control layer (aluminum oxide) was 75 seconds, there was no big difference. As shown in FIG. 26, unlike the results shown in FIG. 24, when the oxidation time of the control layer (aluminum oxide) was 125 seconds, the slope of anomalous hall effect which decreases according to the in-plane magnetic field ($B_x$) was bigger when the voltage applied by the control voltage gate was −(−20 V) than when the voltage applied by the control voltage gate was +(22 V).

The results above confirmed that the polarity of anomalous hall effect could be reversed by the voltage applied through the control voltage gate by regulating the oxidation state of the control layer (9213).

FIG. 27 is a graph illustrating the changes in the perpendicular anisotropy field variation ($\Delta H_k$) and the critical current variation ($\Delta I_c$) according to the oxidation time of the control layer (9213) of the semiconductor device of FIG. 23.

As shown in FIG. 25, when the oxidation time ($t_{ox}$) exceeded 75 seconds, the perpendicular anisotropy field ($H_k$) was increased when the voltage applied by the control voltage gate was +(22 V). On the contrary when the oxidation time was less than 75 seconds, the perpendicular anisotropy field ($H_k$) was decreased when the voltage applied by the control voltage gate was +(22 V). Also, when the oxidation time ($t_{ox}$) exceeded 75 seconds, the critical current for magnetization switching of the free magnetic layer was increased when the voltage applied by the control voltage gate was +(22 V), while when the oxidation time was less than 75 second, the critical current for magnetization switching of the free magnetic layer was decreased when the voltage applied by the control voltage gate was +(22 V). The changes above were attributed to the changes of the perpendicular magnetic anisotropy over the oxidation time, that is, due to the changes of the oxidation state of the aluminum oxide film, the control layer, in the interface of CoFeB/MgO.

FIG. 28~FIG. 30 are graphs illustrating the anomalous hall effect and the magnetization switching according to the oxidation time of the control layer (9213) of the semiconductor device of FIG. 23.

As shown in FIG. 28, when the oxidation time on the control layer (9213) was 25 seconds, when 24 V of voltage was applied on the control voltage gate, the critical current was 6.5 mA. When −24 V of voltage was applied thereon, the critical current was bigger than that, so that it was 8.8 mA. As shown in FIG. 29, when the oxidation time of the control layer (9213) was 75 seconds, the critical current over the polarity of voltage applied on the control voltage gate was not changed. As shown in FIG. 30, when the oxidation time of the control layer (9213) was 125 seconds, unlike the results of FIG. 28, when −24 V of voltage was applied, the absolute value of the critical current ($|I_c|$) was smaller than that when +24 V of voltage was applied.

As shown in FIG. 28~FIG. 30, when the oxidation time of the control layer (9213) was 75 seconds, there was little dependency on the external voltage. Therefore, when the difference of the critical current value according to the changes of the polarity of the voltage applied by the control voltage gate was not big, the control layer could be called the normal oxidized control layer.

When the oxidation time of the control layer (9213) was 25 seconds, when the polarity of the voltage applied on the control voltage gate was +, the critical current could be reduced, compared with when the polarity of the voltage applied on the control voltage gate was −. The control layer in this state can be called the under-oxidized control layer.

When the oxidation time of the control layer (9213) was 125 seconds, when the polarity of the voltage applied on the control voltage gate was −, the critical current could be reduced, compared with when the polarity of the voltage applied on the control voltage gate was +. The control layer in this state can be called the over-oxidized control layer.

As shown in FIG. 28~FIG. 30, the critical current of the semiconductor device based on the spin orbit torque (SOT) effect according to an example of the present invention can be controlled efficiently by the control voltage gate, and more precisely controlled by the oxidation state of the control layer (9213).

FIG. 31 is a diagram illustrating the semiconductor device (10000) based on the spin orbit torque (SOT) effect according to another example of the present invention.

As shown in FIG. 31, the logic semiconductor device (10000) based on the spin orbit torque (SOT) effect according to another example of the present invention comprises the first input terminal for applying current to the first electrode (10100) including the first position and the second position; the first cell (10210) and the second cell (10220) containing a magnetic tunneling junction (MTJ) disposed between the first position and the second position of the first electrode and having a free magnetic layer and a pinned magnetic layer arranged with the neighbored structure of the dielectric layer and the control layer in between them; the output terminal for outputting an output value obtained by adding a value generated by the current passing through the first input terminal and the first cell and a value generated by the current passing through the first input terminal and the second cell; and the second input terminal for applying voltage between the free magnetic layer and the pinned magnetic layer of the first cell and the second cell, wherein the output value resulted from the output terminal is divided into digital 0 or digital 1 according to the level of the input value received by the first input terminal and the second input terminal.

The descriptions of the first electrode, the dielectric layer, the control layer, the free magnetic layer, and the pinned magnetic layer herein are the same as given above for them.

The output value above can be one of the current value, resistance value, and voltage value measured at a certain position or between certain positions of the logic semiconductor device. When the output value is bigger than the reference value set above, it is designated as digital 1, while the output value is smaller than the reference value set above, it is designated as digital 0. Or, when the output value is bigger than the reference value set above, it is designated as digital 0, and when the output value is smaller than the reference value set above, it is designated as digital 1. As described above, the logic semiconductor device according to an example of the present invention is capable of storing and reading information by the binary notation.

The logic semiconductor device based on the spin orbit torque (SOT) effect according to another example of the present invention can be used as at least one of those CMOS AND/OR gate, CMOS NAND/NOR gate, CMOS Inverter, CMOS SRAM, and CMOS Op-AMP.

The first input terminal can apply current on the first electrode containing the first position and the second position, and can control the size of the current applied thereon.

Even though current is applied on the first electrode containing the first position and the second position by the first input terminal, when the flowing current is not enough to change the magnetic characteristics of the free magnetic layer, the magnetic characteristics of the free magnetic layer cannot be changed. Only when current that is big enough to change the magnetic characteristics of the free magnetic layer flows on the first electrode containing the first position and the second position by the first input terminal, the magnetic characteristics of the free magnetic layer can be changed. The current value at this time is called the critical current of the free magnetic layer. That is, the first input terminal can change the electrical or magnetic characteristics of the free magnetic layer by flowing current that is bigger than the critical current value on the first electrode containing the first position and the second position.

A current control switch can be additionally included to control the current applied on the first input terminal. The first input terminal above can be an electrode connected to one end of the first electrode, and the current control switch can have the composition used generally to control the flow of current in a semiconductor.

The magnetization direction of the free magnetic layer of the first cell and the second cell containing the magnetic tunneling junction can be changed by the size of current applied on the first input terminal. At this time, the first cell and the second cell containing the magnetic tunneling junction can have different critical current values to change the magnetization direction.

The control layer (10213) of the first cell and the control layer (10223) of the second cell containing the magnetic tunneling junction can be a normal oxidized control layer, an under-oxidized control layer, or an over-oxidized control layer.

For example, the first cell containing the magnetic tunneling junction can contain a normal oxidized control layer or the first cell containing the magnetic tunneling junction can include an over-oxidized control layer. The first cell having the magnetic tunneling junction can include an under-oxidized control layer or the first cell containing the magnetic tunneling junction can include an over-oxidized control layer.

The second input terminal can apply voltage between the free magnetic layer and the pinned magnetic layer of the first cell and the second cell. The control layer controls the electric level of the interface between the free magnetic layer and the dielectric layer by the voltage applied on the second input terminal, and the critical current value of the cell is controlled by regulating the electric level by the control layer.

To regulate the voltage applied on the second input terminal, a voltage control switch can be additionally included. The second input terminal can be an electrode connected to one side of the second electrode. The voltage control switch can have the composition generally used to control the flow of voltage in a semiconductor.

The second input terminal above can have the composition to apply voltage between the free magnetic layer and the pinned magnetic layer of the first cell and the second cell, which can be a pinned magnetic layer and also can be an electrode connected to the pinned magnetic layer.

The first cell (10210) and the second cell (10220) containing the magnetic tunneling junction can include a material and a composition that can be changed in their electrical or magnetic characteristics by the voltage applied by the second input terminal. The electrical or magnetic characteristics herein can be changed by the size of the critical current to change the magnetization direction of the cell containing the magnetic tunneling junction.

The critical current value of each cell containing the magnetic tunneling junction to change the magnetization direction can be changed by the voltage applied on the first cell (10210) and the second cell (10220) containing the magnetic tunneling junction.

The electric level of the interface of the free magnetic layer (10211) and the dielectric layer (10212) controlled by the control layer (10213) of the first cell by using the voltage applied on the second input terminal can be different from the electric level of the interface of the free magnetic layer (10221) and the dielectric layer (10222) controlled by the control layer (10223) of the second cell. The critical current values of the first cell and the second cell are different from each other by the different electric levels differently controlled by each control layer. The level of output value outputting from the output terminal can be controlled according to the magnetization direction of each free magnetic layer of the first cell and the second cell.

Preferably, the control layer (10213) of the first cell containing the magnetic tunneling junction can be an over-oxidized control layer, and the control layer (10223) of the second cell containing the magnetic tunneling junction can be an under-oxidized control layer. Or, the control layer (10213) of the first cell containing the magnetic tunneling junction can be an under-oxidized control layer, and the control layer (10223) of the second cell containing the magnetic tunneling junction can be an over-oxidized control layer. At this time, the behaviors of the first cell and the second cell containing the magnetic tunneling junction can be differently controlled by the +voltage or the −voltage applied on the second input terminal.

An output value obtained by summing a value generated by the current passing through the first input terminal and the first cell and a value generated by the current passing through the first input terminal and the second cell can be output from the output terminal. The output terminal can be an electrode connected to the pinned magnetic layer, and the output value above can be delivered through the Read-Line.

The output value obtained by summing the value generated by the current passing through the first input terminal and the first cell and the value generated by the current passing through the first input terminal and the second cell can be Tunnel Magnetoresistance or Anomalous Hall Effect (AHE) voltage.

When current is passing through the first input terminal and the first cell, if the magnetization direction of the free magnetic layer and the pinned magnetic layer of the first cell is parallel, the first level output value can be output and at this time the first level output value can be a high current value or a low resistance value. When current is passing through the first input terminal and the first cell, if the magnetization direction of the free magnetic layer and the pinned magnetic layer of the first cell is anti-parallel, the second level output value can be output and at this time the second level output value can be a low current value or a high resistance value.

The output value output from the output terminal can be divided into digital O or digital 1 according to the level of the input value input to the first input terminal and the second input terminal.

The logic semiconductor device based on the spin orbit torque (SOT) effect according to another example of the present invention can be used as a device functioning similarly to the conventional CMOS (complementary metal oxide semiconductor) due to the different polarity of the magnetization switching to voltage.

In the logic semiconductor device (10000) based on the spin orbit torque (SOT) effect according to another example of the present invention, when the voltage applied on the second input terminal is +, the magnetization switching is only possible in the first cell alone. When the voltage applied on the second input terminal is −, the magnetization switching is only possible in the second cell alone. The second input terminal above can apply voltage through the common electrode on the first cell and the second cell, through which one of the first cell and the second cell can have the magnetization direction of the free magnetic layer as the first direction and the magnetization direction of at least one of the cells can be the first direction.

To initialize the magnetization direction of the first cell or the second cell, it is necessary to apply current bigger than the critical current of the first cell or the second cell.

If the magnetization direction of the free magnetic layer of the first cell or the second cell is the first direction or upward direction (Up), the magnetization direction of the pinned magnetic layer of the first cell or the second cell can be antiparallel to the magnetization direction of the free magnetic layer, which is the first direction, by which a high resistance value or a high tunnel magnetoresistance (TMR) can be exhibited. If the magnetization direction of the free magnetic layer of the first cell or the second cell is the second direction or downward direction (Down), the magnetization direction of the pinned magnetic layer of the first cell or the second cell can be the same as that of the free magnetic layer, which is the second direction, and at this time the magnetization direction of the free magnetic layer is parallel to that of the pinned magnetic layer. Accordingly, a low resistance value or a low tunnel magnetoresistance (TMR) can be exhibited FIG. 32 is a diagram illustrating the measurement of AHE (Anomalous Hall Effect) voltage in the semiconductor device (10000) based on the spin orbit torque (SOT) effect according to another example of the present invention.

As shown in FIG. 32, the semiconductor device was constructed with the structure of substrate (oxidized silicon)-first electrode (Ta (5 nm))/free magnetic layer ($Co_{32}Fe_{48}B_{20}$ (CoFeB, 1 nm)/dielectric layer (MgO, 1.6 nm)/control layer ($AlO_x$)/gate oxide layer ($ZrO_x$ 40 nm), wherein ruthenium (Ru) was deposited as the second electrode on the control layer. At this time, the control layer of the first cell was prepared as an n-type pseudo-cell by setting the oxidation time to 25 seconds, and the control layer of the second cell was prepared as a p-type pseudo-cell by setting the oxidation time to 125 seconds.

FIG. 33 is a set of graphs illustrating the input values of the first input terminal and the second input terminal of the semiconductor device of FIG. 32 and the resultant output values thereby measured at the output terminals of the first cell and the second cell.

As shown in FIG. 33, the initial magnetization state was set as the upward direction (Up). Therefore, the anomalous hall resistance of the first cell and the second cell was measured respectively as +2Ω. Next, +24 V of voltage was applied on the second input terminal and then ±12 mA of current was applied on the first input terminal stepwise. Also, the in-plane magnetic field of 10 mT is applied to the same direction as the current direction. At this time, the n-type pseudo-cell showed the magnetization switching from downward (Down) to upward (Up), but the p-type pseudo-cell did not show any change. On the contrary, when −24 V of voltage was applied on the second input terminal, the p-type pseudo-cell was selectively changed in the magnetization direction by the current applied on the first input terminal.

When current bigger than 14 mA was applied on the first input terminal, the first cell and the second cell could be controlled simultaneously regardless of the voltage applied on the first input terminal Therefore, the semiconductor device based on the spin orbit torque (SOT) effect according to another example of the present invention was confirmed that the n-type pseudo-cell could be selectively controlled by applying plus voltage on the second input terminal, and the p-type pseudo-cell could be selectively controlled by applying minus voltage on the second input terminal.

The following output value level can be output from the output terminal as current is applied on the first input terminal and voltage is applied on the second input terminal:

(a) If the magnetization direction of the free magnetic layer of the first cell and the second cell is the first direction, the first level is output, (b) If the magnetization direction of the free magnetic layer of the first cell is the first direction and the magnetization direction of the free magnetic layer of the second cell is the second direction, the second level is output, (c) If the magnetization direction of the free magnetic layer of the first cell is the second direction and the magnetization direction of the free magnetic layer of the second cell is the first direction, the second level is output, and (d) If the magnetization direction of the free magnetic layer of the first cell and the second cell is the second direction, the third level is output.

As shown in FIG. 33, when the magnetization direction of the free magnetic layer of the first cell and the second cell was the first direction, which was magnetization switching upward (Up), the first level was output from the output terminal. When the magnetization direction of at least one of the free magnetic layer of the first cell and the second cell was the first direction and the other was the second direction, the second level was output from the output terminal. When the magnetization direction of the free magnetic layer of the first cell and the second cell was the second direction, which was magnetization switching downward (Down), the third level was output from the output terminal.

FIG. 34 is a diagram illustrating the semiconductor device (11000) based on the spin orbit torque (SOT) effect according to another example of the present invention.

As shown in FIG. 34, the logic semiconductor device (11000) based on the spin orbit torque (SOT) effect according to another example of the present invention comprises the input circuit for applying current to the first electrode (11100) comprising the first position and the second position; the first cell (11210) and the second cell (11220) containing a magnetic tunneling junction (MTJ) disposed between the first position and the second position of the first electrode (11100) and having a free magnetic layer and a pinned magnetic layer arranged with the neighbored structure of the dielectric layer and the control layer in between them; the first input terminal for applying voltage between the free magnetic layer (11211) and the pinned magnetic layer (11214) of the first cell; the second input terminal for applying voltage between the free magnetic layer (11221) and the pinned magnetic layer (11224) of the second cell; and the output terminal for outputting an output value obtained by adding a value generated by the current passing through the first electrode (11100) and the first cell (11210) and a value generated by the current passing through the first electrode (11100) and the second cell (11220). At this time, when the input circuit applies current to the first electrode, the output value output from the output terminal is divided into digital 0 or digital 1 according to the level of the input value input to the first input terminal and the second input terminal.

The descriptions of the first electrode, the dielectric layer, the control layer, the free magnetic layer, and the pinned magnetic layer herein are the same as given above for them.

The input circuit can apply current to the first electrode (11100) containing the first position and the second position, and can control the size of the current applied thereto.

Even though current is applying to the first electrode (11100) containing the first position and the second position, when the flowing current is not enough to change the magnetic characteristics of the free magnetic layer, the magnetic characteristics of the free magnetic layer is not changed. Only when enough current is flowing on the first electrode, the magnetic characteristics of the free magnetic layer can be changed. The current value at this time is called the critical current of the free magnetic layer. That is, the electrical or magnetic characteristics of the free magnetic layers can be changed by flowing current more than the critical current on the first electrode containing the first position and the second position.

A current control switch can be additionally included therein in order to control the current applied on the input circuit. The current control switch can include a switch composition generally used to control the flow of current in a semiconductor.

FIG. 35 is a diagram illustrating the semiconductor device based on the spin orbit torque (SOT) effect comprising the input circuit according to another example of the present invention.

As shown in FIG. 35, the input circuit provides current between the first position and the second position arranged with the first cell (11210) and the second cell (11220) in between them on the first electrode (11100), and can have a path that goes through the writing block (11610), the source-line (3510), the transistor controlling current flowing on the first electrode, the first cell (11210), the second cell (11220), the write-line (11520), and going back to the writing block (11610).

The writing block (11610) can control the source line (11510) and the write line (11520). The switch (11620) above can control the first bit-line (11531), the second bit-line (11532), and the third bit-line (11533). The first bit-line (11531) above can control the transistor regulating current flowing on the first electrode. The second bit-line (11532) above can control the transistor regulating voltage in the first cell. The third bit-line (11533) can control the transistor regulating voltage in the second cell.

The source amplifier (11630) can amplify and recognize the output value of the first cell and the second cell output from the lead lines (11541, 11542).

The magnetization direction of the free magnetic layer of the first cell and the second cell containing the magnetic tunneling junction can be changed by the size of the current applied on the input circuit. At this time, the first cell and the second cell containing the magnetic tunneling junction can have different critical current values to change the magnetization direction.

The first input terminal can apply voltage between the free magnetic layer (11211) and the pinned magnetic layer (11214) of the first cell (11210). The control layer (11213) controls the electric level of the interface between the free magnetic layer (11211) and the dielectric layer (11212) by the voltage applied on the first input terminal, and the critical current value of the first cell (11210) is controlled by regulating the electric level by the control layer (11213).

To regulate the voltage applied on the first input terminal, a voltage control switch can be additionally included in the logic semiconductor device (11000) according to another example of the present invention. The voltage control switch can include a general switch structure to control voltage in a semiconductor, but not always limited thereto.

The first input terminal above can have the composition to apply voltage between the free magnetic layer (11211) and the pinned magnetic layer (11214) of the first cell (11210), which can be the pinned magnetic layer (11214) and also can be the second electrode (11300) connected to the pinned magnetic layer.

The first cell containing the magnetic tunneling junction can include a material and a composition that can be changed in their electrical or magnetic characteristics by the voltage applied by the first input terminal. The electrical or magnetic characteristics herein can be changed by the size of the critical current to change the magnetization direction of the cell containing the magnetic tunneling junction.

The critical current value of the cell containing the magnetic tunneling junction to change the magnetization direction can be changed by the voltage applied on the cell containing the magnetic tunneling junction.

The electric level of the interface of the free magnetic layer and the dielectric layer controlled by the control layer of the first cell by using the voltage applied on the first input terminal can be different from the electric level of the interface of the free magnetic layer and the dielectric layer controlled by the control layer of the second cell. The critical current values of the first cell and the second cell are different from each other by the different electric levels differently controlled by each control layer. The level of output value outputting from the output terminal can be controlled according to the magnetization direction of the free magnetic layer of the first cell.

The control layer of the first cell containing the magnetic tunneling junction can be a normal oxidized control layer, an under-oxidized control layer, or an over-oxidized control layer.

The second input terminal can apply voltage between the free magnetic layer (11211) and the pinned magnetic layer (11214) of the second cell (11224). The control layer (11223) controls the electric level of the interface between the free magnetic layer (11221) and the dielectric layer (11222) by the voltage applied on the second input terminal, and the critical current value of the second cell (11220) is controlled by regulating the electric level by the control layer (11223).

To regulate the voltage applied on the second input terminal, a voltage control switch can be additionally included in the logic semiconductor device according to another example of the present invention. The voltage control switch can include a general switch structure to control voltage in a semiconductor, but not always limited thereto.

The second input terminal above can have the composition to apply voltage between the free magnetic layer (11221) and the pinned magnetic layer (11224) of the second cell (11220), which can be the pinned magnetic layer (11224) and also can be the second electrode (11300) connected to the pinned magnetic layer.

The cell containing the magnetic tunneling junction can include a material and a composition that can be changed in their electrical or magnetic characteristics by the voltage applied by the second input terminal. The electrical or magnetic characteristics herein can be changed by the size of the critical current to change the magnetization direction of the cell containing the magnetic tunneling junction.

The critical current value of the cell containing the magnetic tunneling junction to change the magnetization direction can be changed by the voltage applied on the cell containing the magnetic tunneling junction.

The electric level of the interface of the free magnetic layer and the dielectric layer controlled by the control layer of the second cell by using the voltage applied on the second input terminal can be different from the electric level of the interface of the free magnetic layer and the dielectric layer controlled by the control layer of the first cell. The critical current values of the first cell and the second cell are different from each other by the different electric levels differently controlled by each control layer. The level of output value outputting from the output terminal can be controlled according to the magnetization direction of the free magnetic layer of the second cell.

The control layer of the second cell containing the magnetic tunneling junction can be a normal oxidized control layer, an under-oxidized control layer, or an over-oxidized control layer.

An output value obtained by summing a value generated by the current passing through the first electrode and the first cell and a value generated by the current passing through the first electrode and the second cell can be output from the output terminal.

The electric level of the interface of the free magnetic layer and the dielectric layer can be controlled by the control layer of the first cell and the second cell by using the voltage applied on the first input terminal and the second input terminal. The critical current values of the first cell and the second cell can be controlled according to the electric level controlled by the control layer.

FIG. 36 is a diagram illustrating the measurement of AHE (Anomalous Hall Effect) voltage in the semiconductor device based on the spin orbit torque (SOT) effect according to another example of the present invention.

As shown in FIG. 36, the semiconductor device was constructed with the structure of substrate (oxidized silicon)-first electrode (Ta (5 nm))/free magnetic layer ($Co_{32}Fe_{48}B_{20}$ (CoFeB, 1 nm)/dielectric layer (MgO, 1.6 nm)/control layer ($AlO_x$)/gate oxide layer ($ZrO_x$, 40 nm), wherein ruthenium (Ru) was deposited as the second electrode on the control layer. At this time, the control layers of the first cell and the second cell were prepared as the p-type pseudo-cell by setting the oxidation time to 125 seconds.

FIG. 37 and FIG. 38 are graphs illustrating the anomalous hall effect and the magnetization switching of the first cell and the second cell of the semiconductor device of FIG. 36.

As shown in FIG. 37 and FIG. 38, +24 V was applied on the first input terminal and the second input terminal. When 14.5±0.5 mA of current was applied on the input circuit, the magnetization switching was observed. When 12.5±0.5 mA of current was applied on the input circuit after applying +24 V of voltage on the first input terminal and the second input terminal, the magnetization switching was also observed. As shown in FIG. 36, the first cell and the second cell were p-type pseudo-cells, and the absolute value of the critical current was smaller when the voltage applied on the first input terminal and the second input terminal was negative (−). Also, the in-plane magnetic field of 10 mT is applied to the same direction as the current direction.

If the magnetization direction of the free magnetic layer of the first cell and the second cell is the first direction, current is applied on the input circuit, and voltage is applied on the first input terminal and the second input terminal, the following output value level is output from the output terminal which is to act as AND or OR gate:

(a) When the voltage applied on the first input terminal and the second input terminal is the first level, the magnetization direction of the free magnetic layer of the first cell and the second cell remains the first direction, and then the first level output value is output from the output terminal, (b) When the voltage applied on the first input terminal is the first level and the voltage applied on the second input terminal is the second level, the magnetization direction of the free magnetic layer of the first cell remains the first direction but the magnetization direction of the free magnetic layer of the second cell is changed into the second direction, and then the second level output value is output from the output terminal, (c) When the voltage applied on the first input terminal is the second level and the voltage applied on the second input terminal is the first level, the magnetization direction of the free magnetic layer of the first cell is changed into the second direction but the magnetization direction of the free magnetic layer of the second cell remains the first direction, and then the second level output value is output from the output terminal, and (d) When the voltage applied on the first input terminal and the second input terminal is the second level, the magnetization direction of the free magnetic layer of the first cell and the second cell is changed into the second direction, and then the third level output value is output from the output terminal.

FIG. 39 is a set of graphs illustrating the input values of the first input terminal and the second input terminal of the semiconductor device of FIG. 36 and the resultant output values thereby measured at the output terminals of the first cell and the second cell. Also, the in-plane magnetic field of 10 mT is applied to the same direction as the current direction.

As shown in FIG. 39, when the initial magnetization direction was the upward direction (Up), the normalized anomalous hall resistance of the first cell or the second cell can be changed only when the voltage applied on the first input terminal or the second input terminal was −24 V, because the first cell or the second cell was the p-type pseudo-cell.

The references were defined as follows in order to explain the logic operation of AND gate or OR gate.

$$R_{ref,UP} = (R_{xy,1st} + R_{xy,2nd})/2 = +2\ \Omega$$

$$R_{ref,DOWN} = (R_{xy,1st} + R_{xy,2nd})/2 = -2\ \Omega$$

Referring FIG. 39 and the $R_{ref}$ value defined above, the truth table shown in Table 1 wherein the output value is determined by the input value of the first input terminal and the second input terminal is obtained. The truth table of Table 1 is limited only to when the magnetization direction of the first cell and the second cell is initialized and when the current applied on the input circuit is −12 mA.

TABLE 1

| Logic Input | | $R_{xy,1}$ + | Logic Output | |
|---|---|---|---|---|
| $V_{G,1}$ | $V_{G,2}$ | $R_{xy,2}$ | $R_{ref,UP}$ (+2 Ω) | $R_{ref,DOWN}$ (−2 Ω) |
| −24 V(0) | −24 V(0) | −4 Ω | 0 | 0 |
| −24 V(0) | +24 V(1) | 0 Ω | 0 | 1 |
| +24 V(1) | −24 V(0) | 0 Ω | 0 | 1 |
| +24 V(1) | +24 V(1) | +4 Ω | 1 | 1 |

As shown in Table 1, considering the $R_{ref,UP}$ as the reference, the output value ($R_{output}$ or $R_{xy,1st}+R_{xy,2nd}$) is bigger than the $R_{ref,UP}$ only when +24 V of voltage (second level) is applied on the first input terminal and the second input terminal. Considering the $R_{ref,DOWN}$ as the reference, the output value ($R_{output}$ or $R_{xy,1st}+R_{xy,2nd}$) is smaller than the $R_{ref,DOWN}$ only when −24 V of voltage (first level) is applied on the first input terminal and the second input terminal.

Therefore, when the $R_{ref,UP}$ is taken as the reference value, AND gate is operated, and when the first level or the second level value is output from the output terminal, the output value can be divided into digital 0. When the third level value is output from the output terminal, the output value can be divided into digital 1. That is, when the input value of the first input terminal and the second input terminal is the second level, the value can be divided into digital 1.

When the $R_{ref,DOWN}$ is taken as the reference value, OR gate is operated, and when the first level value is output from the output terminal, the output value can be divided into digital 0. When the second level or the third level value is output from the output terminal, the output value can be divided into digital 1. That is, when at least one of the input values of the first input terminal and the second input terminal is the second level, the value can be divided into digital 1.

If the magnetization direction of the free magnetic layer of the first cell and the second cell is the second direction, current is applied on the input circuit, and voltage is applied on the first input terminal and the second input terminal, the following output value level is output from the output terminal which is to act as NAND or NOR gate:

(a) When the voltage applied on the first input terminal and the second input terminal is the first level, the magnetization direction of the free magnetic layer of the first cell and the second cell is changed into the first direction, and then the first level output value is output from the output terminal, (b) When the voltage applied on the first input terminal is the first level and the voltage applied on the second input terminal is the second level, the magnetization direction of the free magnetic layer of the first cell is changed into the first direction but the magnetization direction of the free magnetic layer of the second cell remains the second direction, and then the second level output value is output from the output terminal, (c) When the voltage applied on the first input terminal is the second level and the voltage applied on the second input terminal is the first level, the magnetization direction of the free magnetic layer of the first cell remains the second direction but the magnetization direction of the free magnetic layer of the second cell is changed into the first direction, and then the second level output value is output from the output terminal, and (d) When the voltage applied on the first input terminal and the second input terminal is the second level, the magnetization direction of the free magnetic layer of the first cell and the second cell remains the second direction, and then the third level output value is output from the output terminal.

FIG. 40 is a diagram illustrating the measurement of AHE (Anomalous Hall Effect) voltage in the semiconductor device based on the spin orbit torque (SOT) effect according to another example of the present invention.

As shown in FIG. 40, the semiconductor device was constructed with the structure of substrate (oxidized silicon)-first electrode (Ta (5 nm))/free magnetic layer ($Co_{32}Fe_{48}B_{20}$ (CoFeB, 1 nm)/dielectric layer (MgO, 1.6 nm)/control layer ($AlO_x$)/gate oxide layer ($ZrO_x$, 40 nm), wherein ruthenium (Ru) was deposited as the second electrode on the control layer. At this time, the control layers of the first cell and the second cell were prepared as the n-type pseudo-cell by setting the oxidation time to 25 seconds.

In FIG. 40, when both of the first cell and the second cell are the n-type pseudo-cells, the magnetization direction to the voltage polarity is opposite to the above and therefore the truth table shown in Table 2 can be obtained.

TABLE 2

| Logic Input | | Logic Output | | |
|---|---|---|---|---|
| $V_{G,1}$ | $V_{G,2}$ | $R_{xy,1}$ + $R_{xy,2}$ | $R_{ref,UP}$ (+2 Ω) | $R_{ref,DOWN}$ (−2 Ω) |
| −24 V(0) | −24 V(0) | +4 Ω | 1 | 1 |
| −24 V(0) | +24 V(1) | 0 Ω | 0 | 1 |
| +24 V(1) | −24 V(0) | 0 Ω | 0 | 1 |
| +24 V(1) | +24 V(1) | −4 Ω | 0 | 0 |

As shown in Table 2, considering the $R_{ref,UP}$ as the reference, the output value ($R_{output}$ or $R_{xy,1st}+R_{xy,2nd}$) is bigger than the $R_{ref,UP}$ only when minus voltage (first level) is applied on the first input terminal and the second input terminal. Considering the $R_{ref,DOWN}$ as the reference, the output value ($R_{output}$ or $R_{xy,1st}+R_{xy,2nd}$) is smaller than the $R_{ref,DOWN}$ only when plus voltage (second level) is applied on the first input terminal and the second input terminal.

Therefore, when the $R_{ref,UP}$ is taken as the reference value, NAND gate is operated, and when the second level or the third level value is output from the output terminal, the output value can be divided into digital 0. When the first level value is output from the output terminal, the output value can be divided into digital 1. That is, when the voltage applied on the first input terminal and the second input terminal is the first level, the value can be divided into digital 1.

When the $R_{ref,DOWN}$ is taken as the reference value, NOR gate is operated, and when the first level or the second level value is output from the output terminal, the output value can be divided into digital 1. When the third level value is output from the output terminal, the output value can be divided into digital 1. That is, only when the voltage applied on the first input terminal and the second input terminal is the second level, the value can be divided into digital 0.

FIG. 41 is a diagram illustrating the semiconductor device (12000) based on the spin orbit torque (SOT) effect according to another example of the present invention.

As shown in FIG. 41, the logic semiconductor device (12000) based on the spin orbit torque (SOT) effect according to another example of the present invention comprises the first input terminal for applying current to the first electrode (12100) including the first position and the second position; the cell (12210) containing a magnetic tunneling junction (MTJ) disposed between the first position and the second position of the first electrode (12100) and having a free magnetic layer (12211) arranged in the first electrode (12100), a dielectric layer (12212) arranged in the free magnetic layer (12211), a control layer (12213) arranged in the dielectric layer (12212), and a pinned magnetic layer (12214) arranged in the control layer (12213); the second input terminal for applying voltage between the free magnetic layer (12211) and the pinned magnetic layer (12214) of the cell (12210); and the output terminal for outputting a value generated by current passing through the first electrode (12100) and the cell (12210), wherein the output value resulted from the output terminal is divided into digital 0 or digital 1 according to the level of the input value received by the first input terminal and the second input terminal.

The descriptions of the first electrode, the dielectric layer, the control layer, the free magnetic layer, and the pinned magnetic layer herein are the same as given above for them.

The first input terminal can apply current to the first electrode containing the first position and the second position, and can control the size of the current applied thereto.

Even though current is applying to the first electrode containing the first position and the second position, when the flowing current is not enough to change the magnetic characteristics of the free magnetic layer, the magnetic characteristics of the free magnetic layer is not changed. Only when enough current is flowing on the first electrode containing the first position and the second position, the magnetic characteristics of the free magnetic layer can be changed. The current value at this time is called the critical current of the free magnetic layer. That is, the electrical or magnetic characteristics of the free magnetic layers can be changed by flowing current more than the critical current on the first electrode containing the first position and the second position.

A current control switch can be additionally included therein in order to control the current applied on the first input terminal. The current control switch can include a switch composition generally used to control the flow of current in a semiconductor.

The magnetization direction of the free magnetic layer of the cell (12210) containing the magnetic tunneling junction can be changed by the size of current applied on the first input terminal.

The second input terminal can apply voltage between the free magnetic layer (12211) and the pinned magnetic layer (12214) of the first cell (12210). The control layer (12213) controls the electric level of the interface between the free magnetic layer (12211) and the dielectric layer (12212) by the voltage applied on the second input terminal, and the critical current value of the cell is controlled by regulating the electric level by the control layer.

The value generated by current passing through the first electrode and the cell can be output from the output terminal.

The output value output from the output terminal can be divided into digital 0 or digital 1 according to the level of the input value input to the first input terminal and the second input terminal.

FIG. 42 is a diagram illustrating the measurement of AHE (Anomalous Hall Effect) voltage in the semiconductor device (12000) based on the spin orbit torque (SOT) effect according to another example of the present invention.

As shown in FIG. 42, the semiconductor device was constructed with the structure of substrate (oxidized silicon)-first electrode (Ta (5 nm))/free magnetic layer ($Co_{32}Fe_{48}B_{20}$ (CoFeB, 1 nm)/dielectric layer (MgO, 1.6 nm)/control layer ($AlO_x$)/gate oxide layer ($ZrO_x$, 40 nm), wherein ruthenium (Ru) was deposited as the second electrode on the control layer. At this time, the control layer of the cell was prepared as the p-type pseudo-cell by setting the oxidation time to 125 seconds.

FIG. 43 is a graph illustrating the anomalous hall effect and the magnetization switching of the cell of the semiconductor device of FIG. 42.

As shown in FIG. 43, the cell herein was the p-type pseudo-cell, and therefore when plus voltage was applied on the second input terminal, the absolute value of the critical current was bigger.

According to the level of the input value input in the first input terminal and the second input terminal, the following output value level is output from the output terminal which is to act as OR gate:

(a) When the first level current is applied on the first input terminal and the first level voltage is applied on the second input terminal, the magnetization direction of the free magnetic layer of the cell remains or is changed into the first direction, and then the first level output value is output from the output terminal, (b) When the first level current is applied on the first input terminal and the second level voltage is applied on the second input terminal, the magnetization direction of the free magnetic layer of the cell remains or is changed into the first direction, and then the first level output value is output from the output terminal, (c) When the second level current is applied on the first input terminal and the first level voltage is applied on the second input terminal, the magnetization direction of the free magnetic layer of the cell remains or can be changed into the first direction, and then the first level output value is output from the output terminal, and (d) When the second level current is applied on the first input terminal and the second level voltage is applied on the second input terminal, the magnetization direction of the free magnetic layer of the cell remains or can be changed into the second direction, and then the second level output value is output from the output terminal.

FIG. 44 is a set of graphs illustrating the values measured at the output terminals according to the input values of the first input terminal and the second input terminal of the semiconductor device of FIG. 42.

As shown in FIG. 44, when ±24 V is applied on the second input terminal and ±13 mA is applied on the first input terminal, only when minus voltage is applied on the second input terminal, the magnetization state or the anomalous hall resistance of the cell is reversed. Also, the in-plane magnetic field of 10 mT is applied to the same direction as the current direction.

Based on FIG. 44, the truth table shown in Table 3 is obtained.

TABLE 3

| Logic Input | | Logic Output |
|---|---|---|
| IIN | $V_G$ | $R_{xy,1} + R_{xy,2}$ |
| −13 mA (0) | −24 V (0) | −2 Ω (0) |
| −13 mA (0) | +24 V (1) | +2 Ω (1) |
| +13 mA (1) | −24 V (0) | +2 Ω (1) |
| +13 mA (1) | +24 V (1) | +2 Ω (1) |

According to the level of the input value input in the first input terminal and the second input terminal, the following levels of output value can be output from the output terminal so that it can act as OR gate. And only when the first level current is applied on the first input terminal and the first level voltage is applied on the second input terminal, the output value can be divided into digital 0. When the first level current is applied on the first input terminal or the first level voltage is applied on the second input terminal, the output value can be divided into digital 1.

FIG. 45 is a diagram illustrating the semiconductor device (13000) based on the spin orbit torque (SOT) effect according to another example of the present invention.

As shown in FIG. 45, the logic semiconductor device based on the spin orbit torque (SOT) effect according to another example of the present invention comprises the first input terminal for applying current to the first electrode (13100); the first cell (13210) containing a magnetic tunneling junction (MTJ) disposed between the first position and the second position of the first electrode (13100) and having a free magnetic layer (13211) and a pinned magnetic layer (13214) arranged with the neighbored structure of the dielectric layer (13212) and the control layer (13213) in between them; the first voltage gate for applying voltage between the free magnetic layer (13211) and the pinned magnetic layer (13214) of the first cell (13210); the second cell (13220) containing a magnetic tunneling junction (MTJ) disposed on the second electrode (13300) receiving current from the first cell and having a free magnetic layer and a pinned magnetic layer arranged with the neighbored structure of the dielectric layer and the control layer in between them; the second voltage gate for applying voltage between the free magnetic layer (13220) and the pinned magnetic layer (13220) of the second cell; the output terminal for outputting an output value output through the second cell; the input circuit in which the current applied from the first input terminal flows along the first electrode (13220), the first cell, and the second electrode (13300); and the output circuit in which the current applied from the first input terminal flows along the first electrode, the first cell, and the second cell.

The descriptions of the first electrode, the dielectric layer, the control layer, the free magnetic layer, and the pinned magnetic layer herein are the same as given above for them.

The first input terminal can apply current to the first electrode containing the first position and the second position, and can control the size of the current applied thereto.

Even though current is applying to the first electrode containing the first position and the second position, when the flowing current is not enough to change the magnetic characteristics of the free magnetic layer, the magnetic characteristics of the free magnetic layer is not changed. Only when enough current is flowing on the first electrode containing the first position and the second position, the magnetic characteristics of the free magnetic layer can be changed. The current value at this time is called the critical current of the free magnetic layer. That is, the electrical or magnetic characteristics of the free magnetic layers can be changed by flowing current more than the critical current on the first electrode containing the first position and the second position.

A current control switch can be additionally included therein in order to control the current applied on the first input terminal. The current control switch can include a switch composition generally used to control the flow of current in a semiconductor.

The first voltage gate can apply voltage between the free magnetic layer (13211) and the pinned magnetic layer (13214) of the first cell (13210).

The second voltage gate can apply voltage between the free magnetic layer (13211) and the pinned magnetic layer (13214) of the second cell (13220).

The output terminal can output the output value through the second cell.

FIG. 46 is a diagram illustrating the semiconductor device based on the spin orbit torque (SOT) effect comprising the input circuit and the output circuit according to another example of the present invention.

As shown in FIG. 46, the input circuit is where current is flowing from the first input terminal through the first electrode (13100), the first cell (13210), and the second cell (13220). The input circuit can have a path that goes through the writing block (13610), the source-line (5510), the transistor controlling current flowing on the first electrode (13100), the first cell (13210), the write-line (13520), the second electrode (13400), and the transistor controlling the first cell (13210).

As shown in FIG. 46, the output circuit is where current provided from the first input terminal is flowing through the first electrode (13100), the first cell (13210), and the second electrode (13400). The output circuit can have a path that goes through the writing block (5610), the source-line (5510), the first electrode (13100), the first cell (13210), the second electrode (13400), the second cell (13220), the read-line (13540), and the source amplifier (SA, 13630).

The writing block (13610) can control the source line (13510) and the write line (13520). The switch (13620) above can control the first bit-line (13531), the second bit-line (13532), and the third bit-line (13533). The first bit-line (13531) above can control the transistor regulating current flowing on the first electrode. The second bit-line (13532) above can control the transistor regulating voltage in the first cell. The third bit-line (13533) can control the transistor regulating voltage in the second cell.

The source amplifier (13630) can amplify and recognize the output value of the first cell and the second cell output from the lead lines (13540).

The level of current flowing from the first cell to the second electrode through the input circuit by the voltage applied on the first voltage gate can be changed by the magnetization direction of the first cell.

The magnetization direction of the free magnetic layer of the second cell can be controlled by the in-plane current on the second electrode controlled by the magnetization direction of the free magnetic layer of the first cell and by the voltage applied by the second voltage gate.

BRIEF DESCRIPTION OF THE MARK OF DRAWINGS

1000, 2000, 3000, 4000, 8000: semiconductor device
1100, 2100, 3100, 4100, 7100: first electrode
1210, 3210, 4210, 6210: first cell
1220, 3220, 4220, 6220: second cell
2210, 2220, 2230, 2240, 2250, 2260, 5210, 5220, 5230, 5240, 5250, 5260: cell
1211, 1221, 3211, 32221, 4211, 4221, 6211, 6221, 7211, 7221, 8100: free magnetic layer
1212, 12222, 3212, 32222, 4212, 4222, 7212, 7222, 8200: dielectric layer
1213, 1223, 3213, 32223, 4213, 4223, 7213, 7223, 8300: pinned magnetic layer
1300, 2300, 3300, 5300: second electrode
4610, 4620, 6610, 6620: gate dielectric layer
4510, 4520, 5510, 5520, 5530, 5540, 5550, 5560, 6510, 6520, 7510, 7520: voltage circuit
2400, 5400: current control switch
9000, 10000, 11000, 12000, 13000: semiconductor device
9100, 10100, 11100, 12100, 13100: first electrode
9210, 10210, 11210, 12210, 13210: first cell
9211, 10211, 11211, 12211, 13211: first cell free magnetic layer
9212, 10212, 11212, 12212, 13212: first cell dielectric layer
9213, 10213, 11213, 12213, 13213: first cell control layer
9214, 10214, 11214, 12214, 13214: first cell pinned magnetic layer
9220, 10220, 11220, 12220, 13220: second cell
9221, 10221, 11221, 12221, 13221: first cell free magnetic layer
9222, 10222, 11222, 12222, 13222: first cell dielectric layer
9223, 10223, 11223, 12223, 13223: first cell control layer
9224, 10224, 11224, 12224, 13224: first cell pinned magnetic layer
9300, 10300, 11300, 12300, 13300: first cell second electrode
10400, 11400, 13400: second cell second electrode
11510, 13510: source-line
11520, 13520: write-line
11530, 13530: bit-line
11531, 13531: first bit-line
11532, 13532: second bit-line
11533, 13533: third bit-line
11540, 13540: read-line
11610, 13610: writing block
11620, 13620: switch
11630, 13630: source amplifier Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended Claims.

What is claimed is:

1. A logic semiconductor device based on a spin orbit torque (SOT) effect comprising:
   a first input terminal for applying current to a first electrode including a first position and a second position;
   a first cell and a second cell containing a magnetic tunneling junction (MTJ) disposed between the first position and the second position of the first electrode and having a free magnetic layer and a pinned magnetic layer arranged with a neighbored structure of a dielectric layer and a control layer in between;
   an output terminal for outputting an output value obtained by adding a value generated by the current passing through the first input terminal and the first cell and a value generated by the current passing through the first input terminal and the second cell; and
   a second input terminal for applying voltage between the free magnetic layer and the pinned magnetic layer of the first cell and the second cell, wherein the output value resulted from the output terminal is divided into digital 0 or digital 1 according to a level of the input value received by the first input terminal and the second input terminal.

2. The logic semiconductor device based on the spin orbit torque (SOT) effect according to claim 1, wherein the electric level of the interface of the free magnetic layer and the dielectric layer controlled by the control layer of the first cell is different from the electric level of the interface of the free magnetic layer and the dielectric layer controlled by the control layer of the second cell by using the voltage applied on the second input terminal, the critical current values of the first cell and the second cell are different from each other by the different electric levels differently controlled by each control layer, and the level of output value outputting from the output terminal is controlled according to the magnetization direction of each free magnetic layer of the first cell and the second cell.

3. The logic semiconductor device based on the spin orbit torque (SOT) effect according to claim 1, wherein the following output value level is output from the output terminal as current is applied on the first input terminal and voltage is applied on the second input terminal:
   (a) If the magnetization direction of the free magnetic layer of the first cell and the second cell is the first direction, the first level is output, (b) If the magnetization direction of the free magnetic layer of the first cell is the first direction and the magnetization direction of the free magnetic layer of the second cell is the second direction, the second level is output,
(c) If the magnetization direction of the free magnetic layer of the first cell is the second direction and the magnetization direction of the free magnetic layer of the second cell is the first direction, the second level is output, and
(d) If the magnetization direction of the free magnetic layer of the first cell and the second cell is the second direction, the third level is output.

\* \* \* \* \*